United States Patent
Wu

(10) Patent No.: US 6,744,089 B2
(45) Date of Patent: Jun. 1, 2004

(54) SELF-ALIGNED LATERAL-TRANSISTOR DRAM CELL STRUCTURE

(75) Inventor: Ching-Yuan Wu, Hsinchu (TW)

(73) Assignee: Intelligent Sources Development Corp., Hsinchu (TW)

( * ) Notice: Subject to any disclaimer, the term of this patent is extended or adjusted under 35 U.S.C. 154(b) by 6 days.

(21) Appl. No.: 10/236,929

(22) Filed: Sep. 9, 2002

(65) Prior Publication Data

US 2004/0046199 A1 Mar. 11, 2004

(51) Int. Cl.[7] .............................................. H01L 27/108
(52) U.S. Cl. ............................ 257/301; 257/68; 257/71; 257/296; 257/298; 257/905; 257/906; 257/908
(58) Field of Search ..................... 257/68, 71, 295–313, 257/905–908

(56) References Cited

U.S. PATENT DOCUMENTS

| | | | | |
|---|---|---|---|---|
| 5,525,531 A | * | 6/1996 | Bronner et al. | 438/152 |
| 5,831,301 A | * | 11/1998 | Horak et al. | 257/302 |
| 5,977,578 A | * | 11/1999 | Tang | 257/296 |
| 5,998,821 A | * | 12/1999 | Hieda et al. | 257/301 |
| 6,265,742 B1 | * | 7/2001 | Gruening et al. | 257/304 |
| 6,391,705 B1 | * | 5/2002 | Hsiao et al. | 438/243 |
| 6,489,646 B1 | * | 12/2002 | Jang | 257/296 |
| 6,552,382 B1 | * | 4/2003 | Wu | 257/305 |

* cited by examiner

*Primary Examiner*—David Nelms
*Assistant Examiner*—Andy Huynh
(74) *Attorney, Agent, or Firm*—Pro-Techtor International Services

(57) ABSTRACT

A self-aligned lateral-transistor DRAM cell structure is disclosed by the present invention, in which a trench structure comprises a trench region and a trench-isolation region being formed in a side portion of the trench region and a self-aligned lateral-transistor structure comprises a merged common-source diffusion region, a self-aligned gate-stack region, and a self-aligned common-drain diffusion region being formed in another side portion of the trench region by using spacer-formation techniques. The unit cell size of the self-aligned lateral-transistor DRAM cell structure can be fabricated to be equal to 6 $F^2$ or smaller. The self-aligned lateral-transistor DRAM cell structure is used to implement two contactless DRAM arrays for high-speed read and write operations.

12 Claims, 14 Drawing Sheets

SELF-ALIGNED LATERAL-TRANSISTOR DRAM CELL STRUCTURE

BACKGROUND OF THE INVENTION

1. Field of the Invention

The present invention relates generally to a lateral-transistor DRAM memory cell and its manufacturing methods and, more particularly, to a self-aligned lateral-transistor DRAM cell structure and its manufacturing methods.

2. Description of Related Art

A dynamic random-access-memory (DRAM) cell including an access transistor and a storage capacitor has become the most important storage element in electronic system, especially in computer and communication system. The DRAM density is increased very rapidly in order to decrease the cost per bit and, therefore, an advanced photolithography is in general needed to decrease the minimum-feature-size (F) of a cell.

The output voltage of a DRAM cell is proportional to the capacitance value of the storage capacitor of the DRAM cell and, therefore, the storage capacitor must have a satisfactory capacitance value to have stable operation of the cell as the applied voltage is scaled. Basically, the storage capacitor can be implemented in a trench-type or a stack-type. The trench-type is formed by forming a deep trench in a semiconductor substrate without increasing the surface area of the semiconductor-substrate surface. The stack-type is formed by implementing a capacitor structure over the access transistor and its nearby dummy-transistor structure through the conductive contact-plug over the node diffusion region of the access transistor. Basically, the cell size of the stack-type DRAM is limited by a dummy transistor being formed over the isolation region. Accordingly, the limit cell size of the stack-type DRAM is 8 $F^2$ for shallow-trench-isolation. However, the cell size of a trench-type lateral-transistor DRAM is limited by the space between nearby deep-trench capacitors and the separation between the lateral access transistor and the deep-trench capacitor. Therefore, the limit cell size of a trench-type lateral-transistor DRAM is also 8 $F^2$ if the separation between the lateral access transistor and the trench capacitor can't be minimized.

A typical example of a trench-type lateral-transistor DRAM cell is shown in FIG. 1, in which a deep trench is formed in a semiconductor substrate 100. A trench capacitor is formed in a lower portion of the deep trench, in which a lower capacitor node 101 is formed by a heavily-doped n+ diffusion region using an arsenic-silicate-glass (ASG) film as a dopant diffusion source; an upper capacitor node 103a is made of doped polycrystalline-silicon; and a capacitor-dielectric layer 102 is formed by a composite dielectric layer such as an oxide-nitride-oxide structure or a nitride-oxide structure. An oxide collar 104 is used to separate the lower capacitor node 101 from a source diffusion region 105a, 105b, and a capacitor-node connector 103b being made of doped polycrystalline-silicon is used to electrically connect the upper capacitor node 103a to a source conductive node 103c. The source conductive node 103c is made of heavily-doped polycrystalline-silicon to act as a dopant diffusion source for forming an n+ source diffusion region 105a. A shallow-trench-isolation (STI) region 106 is filled with a CVD-oxide layer in order to separate nearby trench capacitors. Two gate-stacks 108, 109 are formed over an upper surface, in which one gate-stack 108 is acted as a passing word-line and another gate-stack 109 is acted as an excess transistor. A common-source diffusion region 105b, 105a and a common-drain diffusion region 107 for a bit-line node are formed in an upper surface portion of the semiconductor substrate 100. From FIG.1, it is clearly seen that the limit cell size is 8 $F^2$ if the space between two nearby trench capacitors is defined to be a minimum-feature-size (F) of technology used.

Apparently, the common-source diffusion region 105b can be removed and the gate-stack 109 shown in FIG. 1 can be formed in a self-aligned manner, then the semiconductor surface area occupied by a cell can be reduced to be 6 $F^2$.

It is, therefore, a major objective of the present invention to offer a self-aligned lateral-transistor DRAM cell structure for obtaining a cell size of 6 $F^2$ or smaller by using self-aligned techniques.

It is another objective of the present invention to easily offer different implant regions for forming punch-through stops and adjusting threshold-voltages of the lateral transistor and the parasitic collar-oxide transistor in a self-aligned manner so a deeper trench is not required.

It is a further objective of the present invention to offer a manufacturing method for forming a self-aligned lateral-transistor DRAM cell structure and its contactless DRAM arrays with less critical masking photoresist steps.

It is yet another objective of the present invention to offer two different contactless DRAM array structures for high-speed read and write operations.

SUMMARY OF THE INVENTION

A self-aligned lateral-transistor DRAM cell structure and its contactless DRAM arrays are disclosed by the present invention. The self-aligned lateral-transistor DRAM cell structure comprises a trench structure and a self-aligned lateral-transistor structure, in which the trench structure comprises a deep-trench region having a trench capacitor and a second-type shallow-trench-isolation region being formed in a side portion of the deep-trench region and the self-aligned lateral-transistor structure comprises a merged common-source diffusion region, a self-aligned gate-stack region, a self-aligned common-drain diffusion region, and different implant regions under the self-aligned lateral-transistor structure for forming punch-through stops of the self-aligned lateral-transistor and the parasitic collar-oxide transistor. The deep-trench region comprises a lower capacitor node made of an n+ diffusion region being formed in a lower portion of a deep trench, a capacitor-dielectric layer being formed over the lower capacitor node, an upper capacitor node being formed over the capacitor-dielectric layer, a collar-oxide layer together with a capacitor-node connector being formed over a portion of the capacitor-dielectric layer and the upper capacitor node, and a source conductive node defined by a first sidewall dielectric spacer being formed over the collar-oxide layer and the capacitor-node connector to act as a dopant diffusion source for forming a merged common-source diffusion region. The second-type shallow-trench-isolation region being formed in a side portion of the deep-trench region comprises a second-type first raised field-oxide layer with a bottom surface level approximately equal to that of the collar-oxide layer and an n+ diffusion region being formed under the second-type first raised field-oxide layer. The self-aligned gate-stack region comprises a highly conductive-gate layer over a gate-dielectric layer being defined by a third sidewall dielectric spacer is formed outside of a second sidewall dielectric spacer. The self-aligned common-drain diffusion region of a second conductivity type comprises a lightly-doped common-drain diffusion region being formed by aligning to the self-aligned gate-stack region and a shallow heavily-doped common-drain diffusion region being formed within the lightly-doped common-drain diffusion region by aligning to a fourth sidewall dielectric spacer being formed over an outer sidewall of the self-aligned gate-stack region. The merged common-source diffusion region of the second conductivity type is formed near the source conductive node under the second sidewall dielectric spacer. The cell size of the self-aligned lateral-transistor DRAM cell structure can be fabricated to be equal to 6 $F^2$ or smaller.

The self-aligned lateral-transistor DRAM cell structure of the present invention is used to implement two contactless DRAM arrays. A first-type contactless DRAM array comprises a plurality of self-aligned lateral transistor DRAM cells, a plurality of metal bit-lines integrated with planarized common-drain conductive islands being patterned to be aligned above a plurality of active regions, and a plurality of capping conductive-gate layers over conductive-gate layers to act as a plurality of conductive word-lines being formed transversely to the plurality of metal bit-lines. A second-type contactless DRAM array comprises a plurality of self-aligned lateral-transistor DRAM cells, a plurality of metal word-lines integrated with planarized capping conductive-gate islands over conductive-gate islands being patterned to be aligned above a plurality of active regions, and a plurality of highly conductive common-drain bus-lines acted as a plurality of conductive bit-lines being formed transversely to the plurality of metal word-lines.

DETAILED DESCRIPTION OF THE PREFERRED EMBODIMENTS

Figure 1:
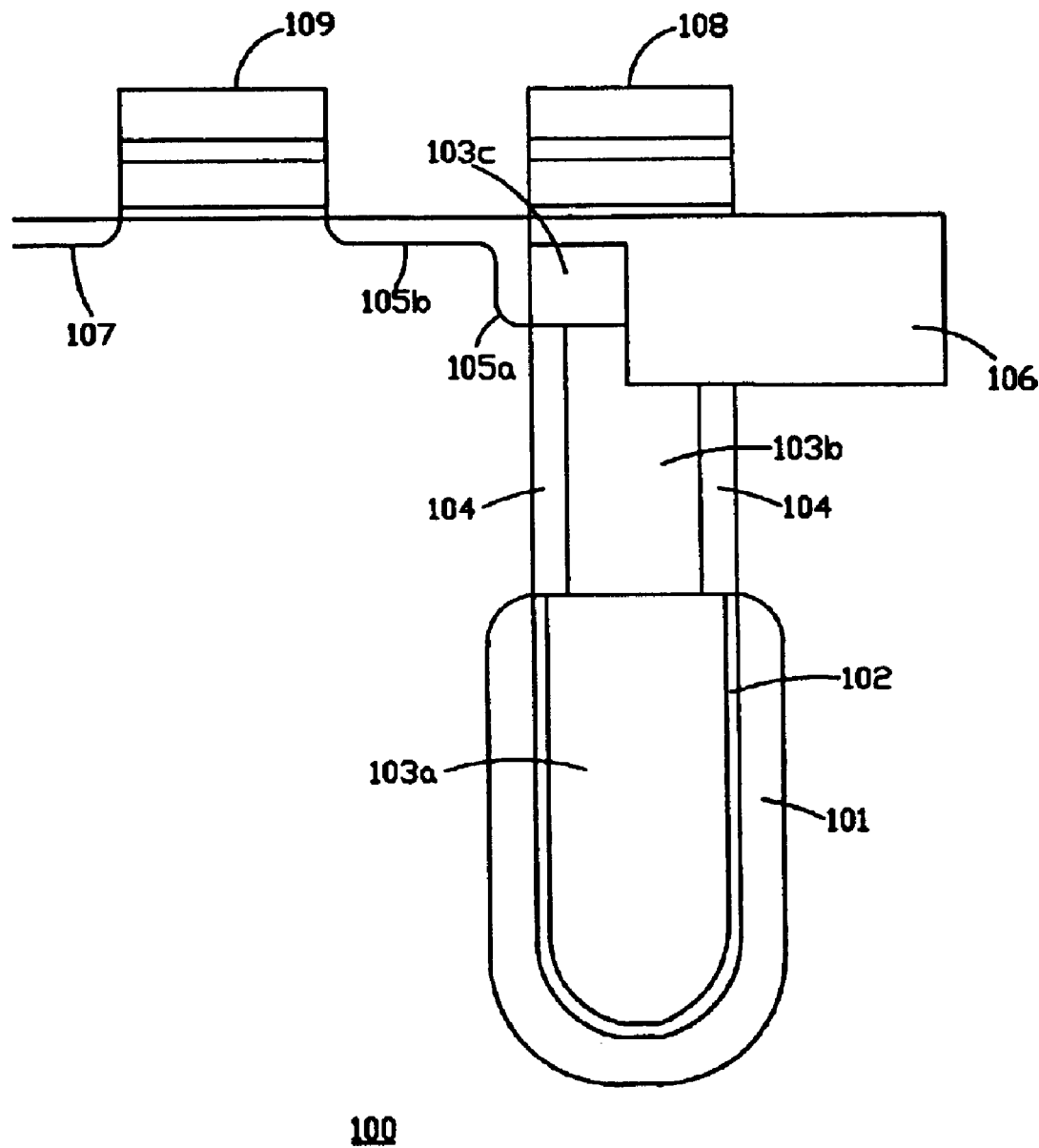
FIG. 1 shows a typical schematic diagram of a trench-type lateral-transistor DRAM cell of the prior art.
Figure 2A:
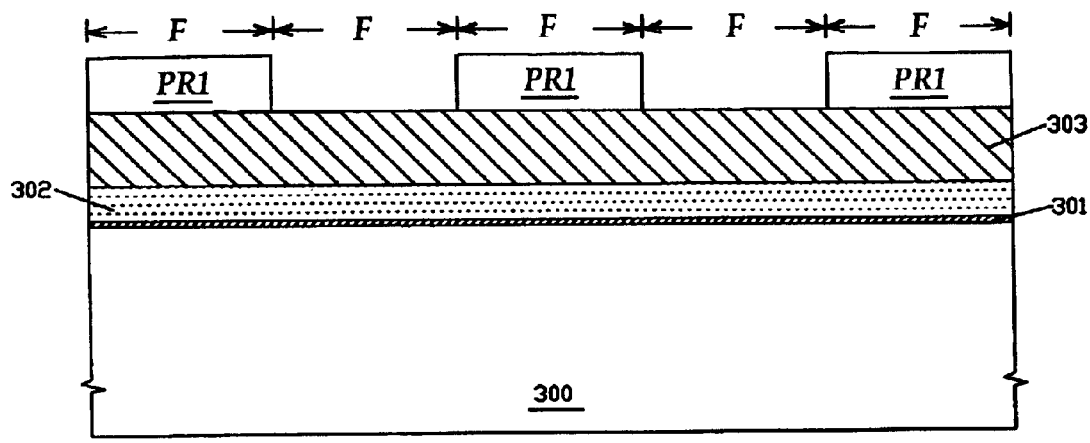
FIG. 2A through FIG. 2C show the process steps and their cross-sectional views of fabricating a first-type shallow-trench-isolation structure for forming a self-aligned lateral-transistor DRAM cell structure of the present invention.
Figure 2B:
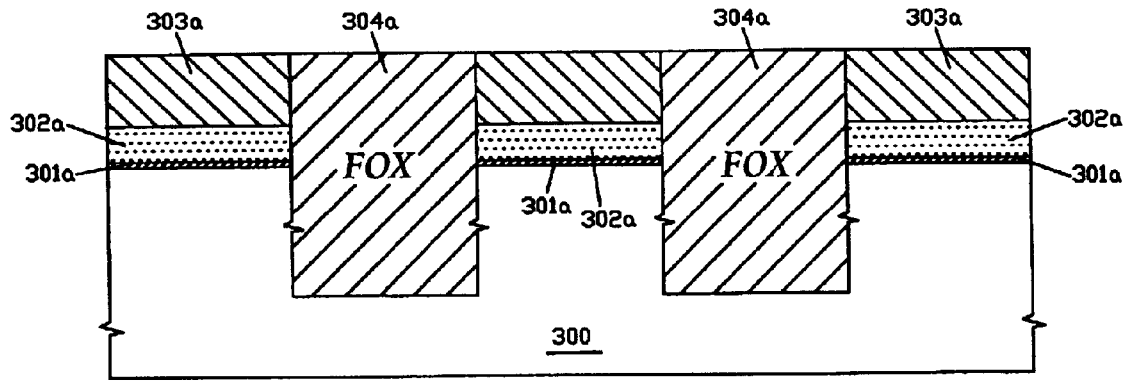
Figure 2C:
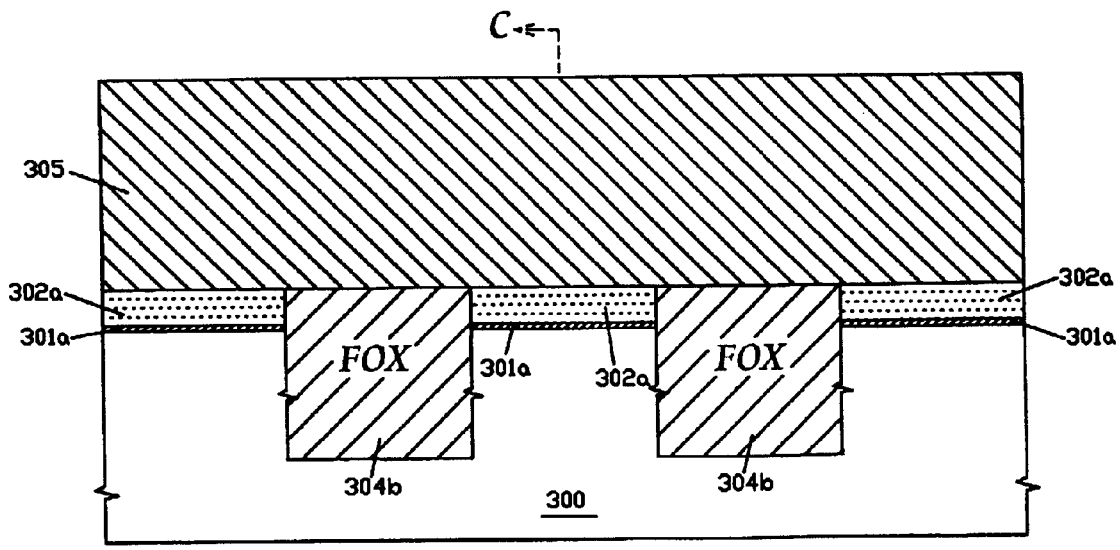

Referring now to FIG. 2A through FIG. 2C, there are shown the process steps and their cross-sectional views of fabricating a first-type shallow-trench-isolation (STI-1) structure for forming a self-aligned lateral-transistor DRAM cell structure of the present invention. FIG. 2A shows that a first dielectric layer 301 is formed on a semiconductor substrate 300 of a first conductivity type, a first conductive layer 302 is formed on the first dielectric layer 301, a first masking dielectric layer 303 is formed over the first conductive layer 302, and a plurality of masking photoresist PR1 are formed over the first masking dielectric layer 303 to define a plurality of active regions (under PR1) and a plurality of first-type STI regions (STI-1) (outside of PR1). The first dielectric layer 301 is preferably a thermal-oxide layer or a nitrided thermal-oxide layer and its thickness is preferably between 50 Angstroms and 200 Angstroms. The first conductive layer 302 is preferably a doped polycrystalline-silicon or doped amorphous-silicon layer as deposited by low-pressure chemical-vapor-deposition (LPCVD) and its thickness is preferably between 200 Angstroms and 3000 Angstroms. The first masking dielectric layer 303 is preferably made of silicon-nitride as deposited by LPCVD and its thickness is preferably between 1000 Angstroms and 3000 Angstroms. It should be noted that a first anti-reflection coating (ARC) layer (not shown) can be formed over the first masking dielectric layer 303 to act as a hard masking layer for patterning the first masking dielectric layer 303. FIG. 2A shows that each of the plurality of active regions (AA) and each of the plurality of first-type STI regions (STI-1) can be defined to be a minimum-feature-size (F) of technology used.

FIG. 2B shows that the first masking dielectric layer 303, the first conductive layer 302, and the first dielectric layer 301 outside of the plurality of masking photoresist PR1 are sequentially removed by using anisotropic dry etching; the semiconductor substrate 300 is then anisotropically etched to form first-type shallow trenches, and the plurality of masking photoresist PR1 are then stripped; and subsequently, the first-type shallow trenches are refilled with first-type planarized field-oxide layers 304a. The depth of the first-type shallow trenches in the semiconductor substrate 300 is between 4000 Angstroms and 15000 Angstroms. The first-type planarized field-oxide layer 304a is preferably made of silicon-dioxide, phosphosilicate glass (p-glass), or boro-phosphosilicate glass (BP-glass) as deposited by high-density plasma (HDP) CVD or plasma-enhanced (PE) CVD, and is formed by first depositing a thick-oxide film 304 to fill up each gap formed by the first-type shallow trenches and then planarizing the deposited thick-oxide film 304 using chemical-mechanical polishing (CMP) with the first masking dielectric layer 303a as a polishing stop.

FIG. 2C shows that the first-type planarized field-oxide layers 304a are etched back to a depth equal to a thickness of the first masking dielectric layer 303a to form first-type first raised field-oxide layers 304b and then the first masking dielectric layers 303a are removed by using hot-phosphoric acid or anisotropic dry etching; and subsequently, a second masking dielectric layer 305 is formed over a flat surface being alternately formed by the first conductive layer 302a and the first-type first raised field-oxide layer 304b. The second masking dielectric layer 305 is preferably made of silicon-nitride as deposited by LPCVD and its thickness is preferably between 3000 Angstroms and 10000 Angstroms. The cross-sectional view along an active region as indicated by a C–C' line is shown in FIG. 3A.

Figure 3A:
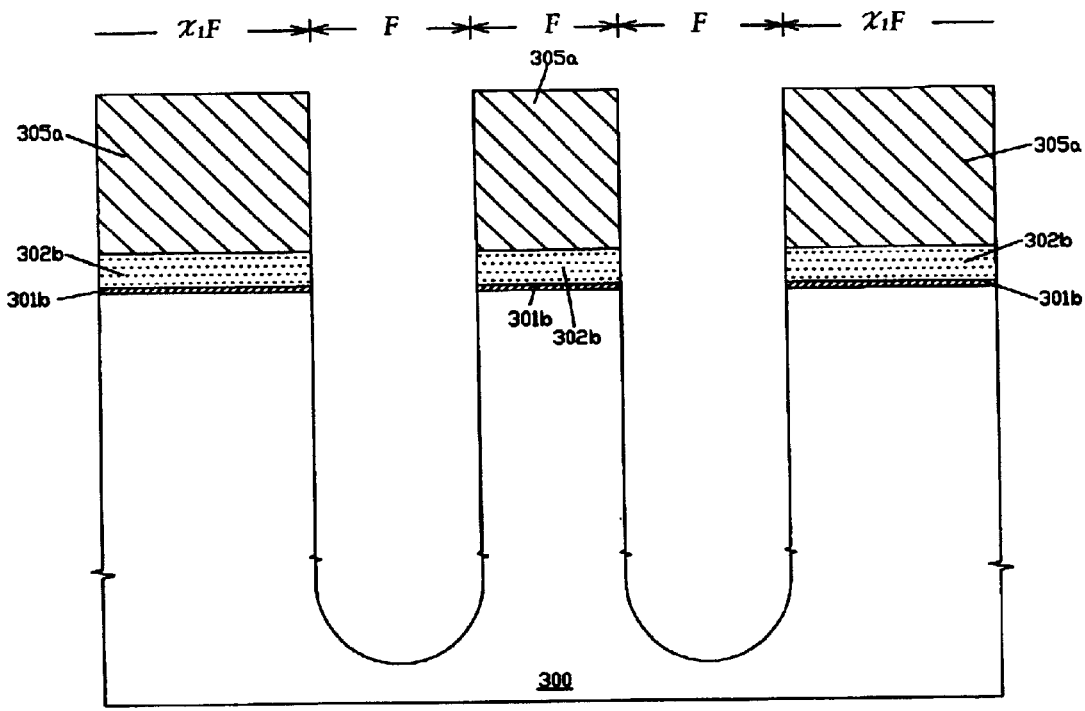
FIG. 3A through FIG. 3J show the process steps and their cross-sectional views of fabricating a common platform structure for a self-aligned lateral-transistor DRAM cell structure of the present invention.

Referring now to FIG. 3A through FIG. 3J, there are shown the process steps and their cross-sectional views of fabricating a common platform structure for a self-aligned lateral-transistor DRAM cell structure of the present invention. FIG. 3A shows that a plurality of deep trenches are formed in the semiconductor substrate 300, which includes a masking photoresist step for patterning the second masking dielectric layer 305, an anisotropic dry etching process to sequentially remove the first conductive layer 302a and the first dielectric layer 301a, and a deep-trench etching process. It should be noted that the first-type first raised field-oxide layers 304b in each of the plurality of first-type STI regions are also slightly etched during the removal of the first dielectric layers 301a to form first-type second raised field-oxide layers 304c between the second masking dielectric layers 305a. FIG. 3A also shows that the width of the deep trenches (DT) can be defined to be a minimum-feature-size (F) of technology used; the space between the nearby deep-trenches (DT) is a trench-isolation region, which can also be defined to be a minimum-feature-size of technology used; and a self-aligned lateral-transistor region is defined by $X_1$ F, wherein $X_1$ is a scale factor.

Figure 3B:
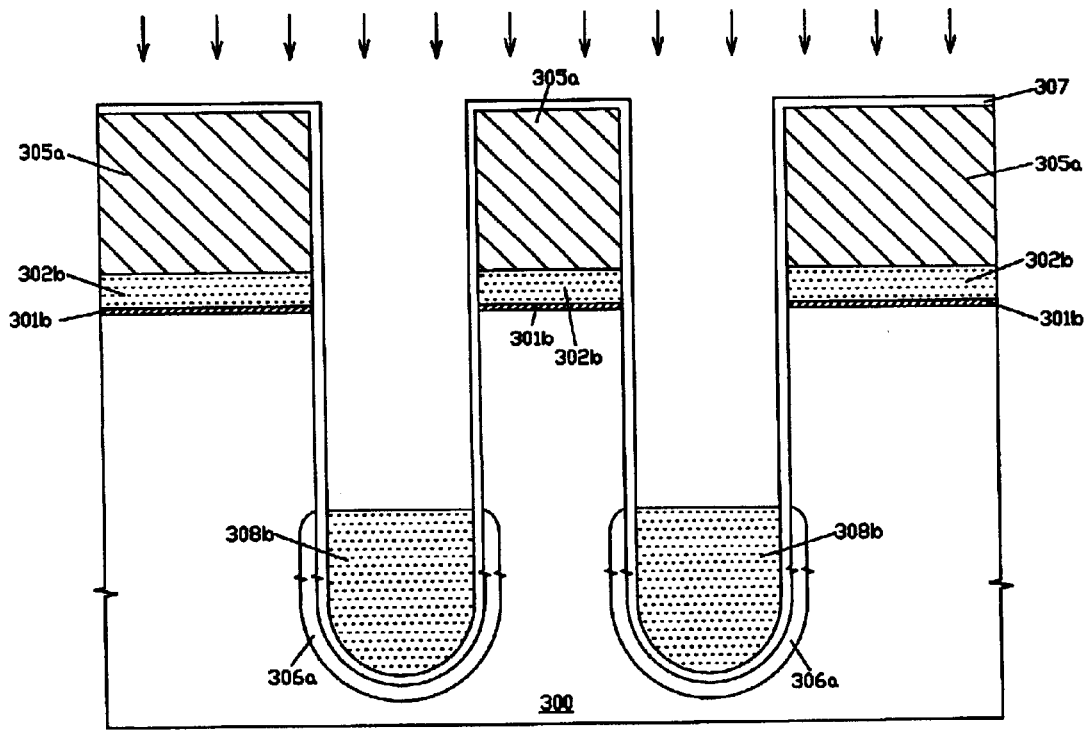

FIG. 3B shows that a lower capacitor node 306a made of a heavily-doped n+ diffusion region is formed in a lower portion of the deep trench; a capacitor-dielectric layer 307 is then formed over a formed structure surface; an upper capacitor node 308b is formed in a lower portion of the deep trench; and subsequently, an ion-implantation is performed in a self-aligned manner to heavily dope the upper capacitor nodes 308b with a high dose of doping impurities of a second conductivity type. The lower capacitor node 306a is formed by the following steps: depositing an arsenic-silicate-glass (ASG) film over a formed structure surface shown in FIG. 3A, forming an etched-back photoresist layer in a lower portion of the deep trench, removing the arsenic-silicate-glass film over a top surface level of the etched-back photoresist layer, removing the etched-back photoresist layer, forming a capping silicon-dioxide layer over the formed structure surface, performing a drive-in process to diffuse the dopants in the remained arsenic-silicate-glass films into the semiconductor substrate 300 to form the lower capacitor nodes 306a, and removing the capping silicon-dioxide layer and the remained arsenic-silicate-glass films. The capacitor-dielectric layer 307 is preferably made of a composite dielectric layer such as an oxide-nitride-oxide (ONO) structure or a nitride-oxide (NO) structure. The upper capacitor node 308b is preferably made of doped polycrystalline-silicon as deposited by LPCVD and is formed by first forming a planarized doped polycrystalline-silicon layer 308a to fill up each gap formed over the deep trenches and then etching back the planarized doped polycrystalline-silicon layer 308b to form the upper capacitor nodes 308b in the lower portion of the deep trenches.

Figure 3C:
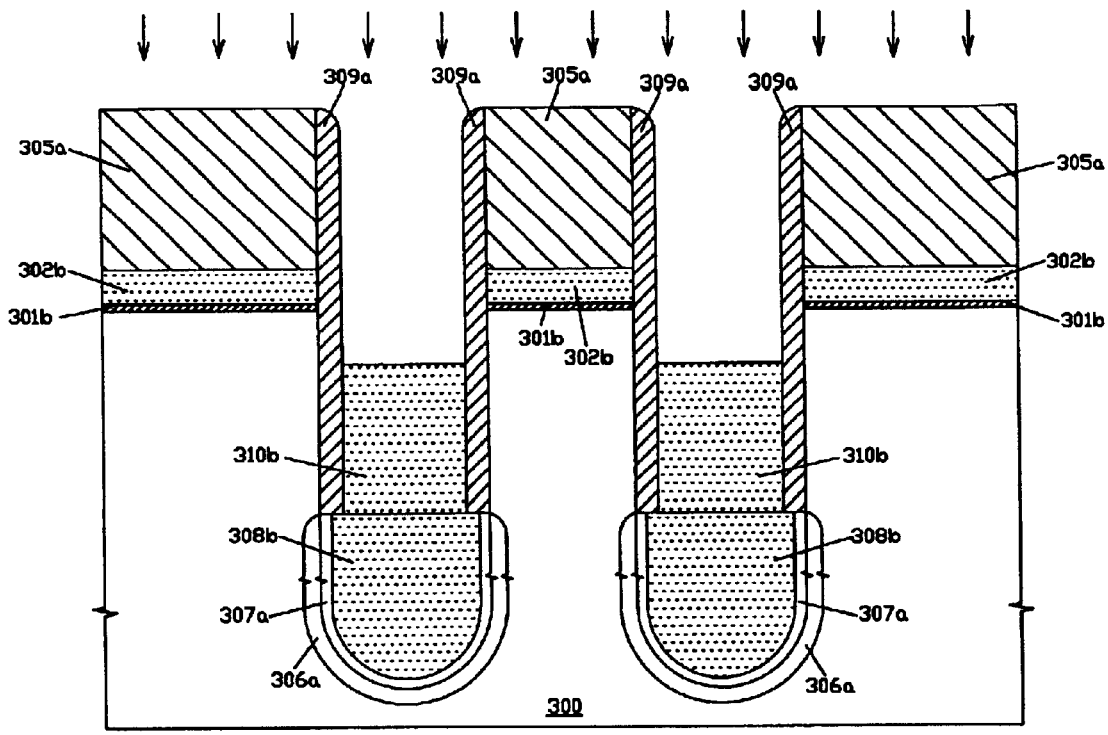

FIG. 3C shows that the capacitor-dielectric layer 307 above a top surface level of the upper capacitor node, 308b is removed by wet etching or isotropic dry etching; a silicon-dioxide layer 309 is deposited over a formed structure surface and is then etched back a thickness of the deposited silicon-dioxide layer 309 to form a sidewall silicon-dioxide spacer 309a over each sidewall of the deep trenches; a planarized doped polycrystalline-silicon layer 310a is formed to fill up each gap between the sidewall silicon-dioxide spacers 309a and is then etched back to form capacitor-node connector layers 310b; and subsequently, an ion-implantation is performed to heavily dope the capacitor-node connector layers 310b with a high dose of doping impurities of the second conductivity type.

Figure 3D:
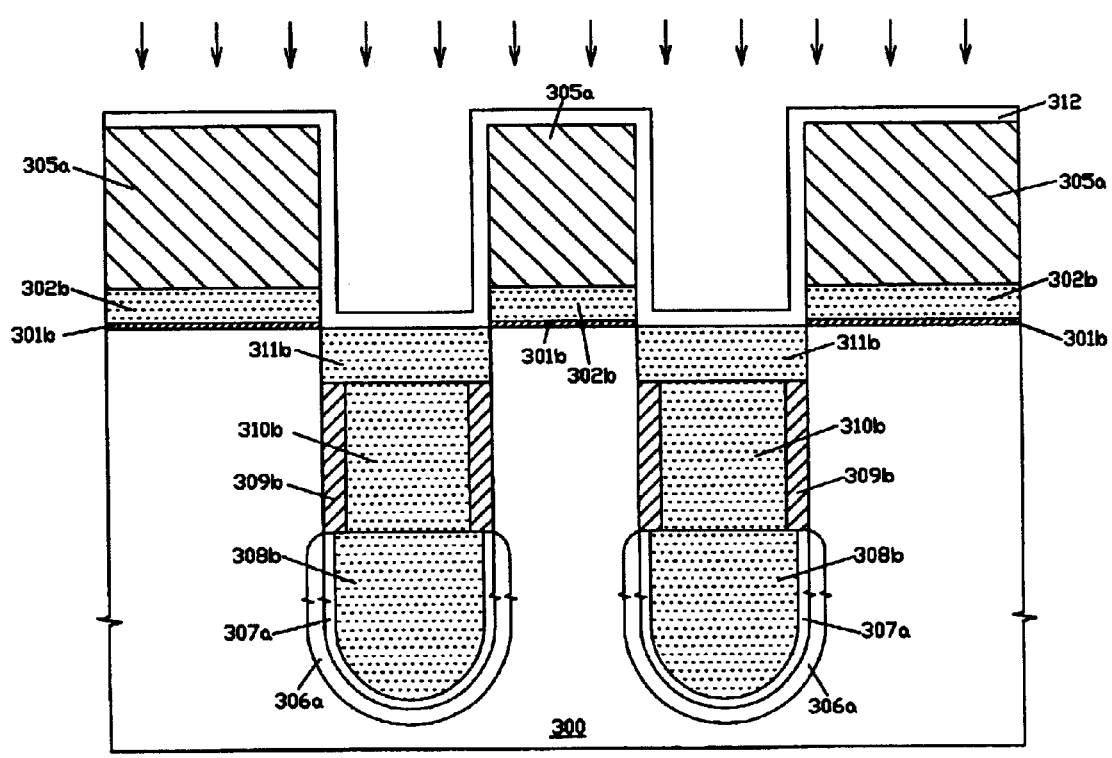

FIG. 3D shows that the sidewall silicon-dioxide spacers 309a above a top surface level of the capacitor-node connector layer 310b are removed to form a collar-oxide layer 309b in each of the deep trenches by dipping in buffered hydrofluoric acid or dilute hydrofluoric acid solution; a source conductive layer 311b is formed over the collar-oxide layer 309b and the capacitor-node connector layer 310b; a protective silicon-dioxide layer 312 is formed over a formed structure surface; and subsequently, an ion-implantation is performed to implant a high dose of doping impurities of the second conductivity type into the source conductive layers 311b in a self-aligned manner to act as the dopant diffusion sources for forming merged common-source diffusion regions 318a in a later process. The source conductive layer 311b is preferably made of doped polycrystalline-silicon or intrinsic polycrystalline-silicon as deposited by LPCVD and is formed by first depositing, then planarizing, and etching back, and the top surface level of the source conductive layer 311b is approximately equal to the top surface of the semiconductor substrate 300. The protective silicon-dioxide layer 312 is preferably deposited by LPCVD or HTO deposition and its thickness is preferably between 100 Angstroms and 500 Angstroms. It should be noted that the protective silicon-dioxide layer 312 is mainly used to prevent the trench surface from ion-implantation and also to control the depth of ion-implantation for forming a graded common-source doping profile in nearby semiconductor substrate 300.

Figure 3E:
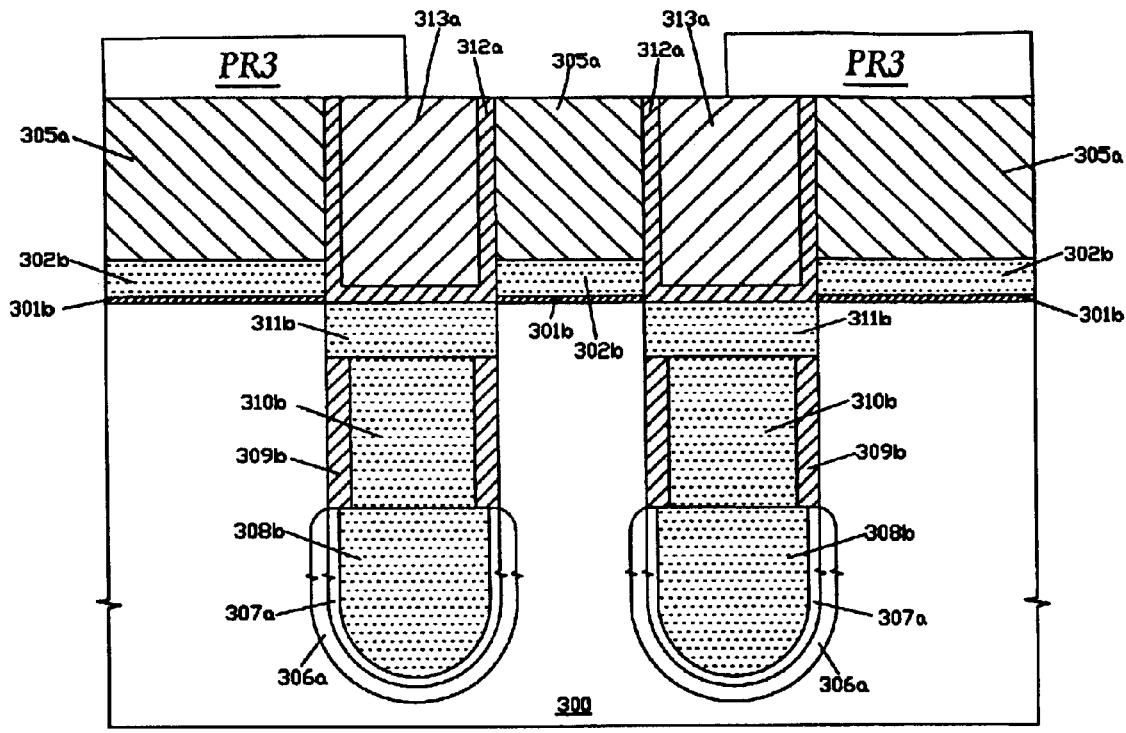

FIG. 3E shows that a first planarized thick-oxide layer 313a is formed over the etched protective silicon-dioxide layer 312a using CMP, a plurality of masking photoresist (PR3) are formed over the self-aligned lateral-transistor regions and a portion of nearby trench regions. The first planarized thick-oxide layer 313a is preferably made of silicon-dioxide, P-glass, or BP-glass as deposited by LPCVD, HDPCVD, or PECVD.

Figure 3F:
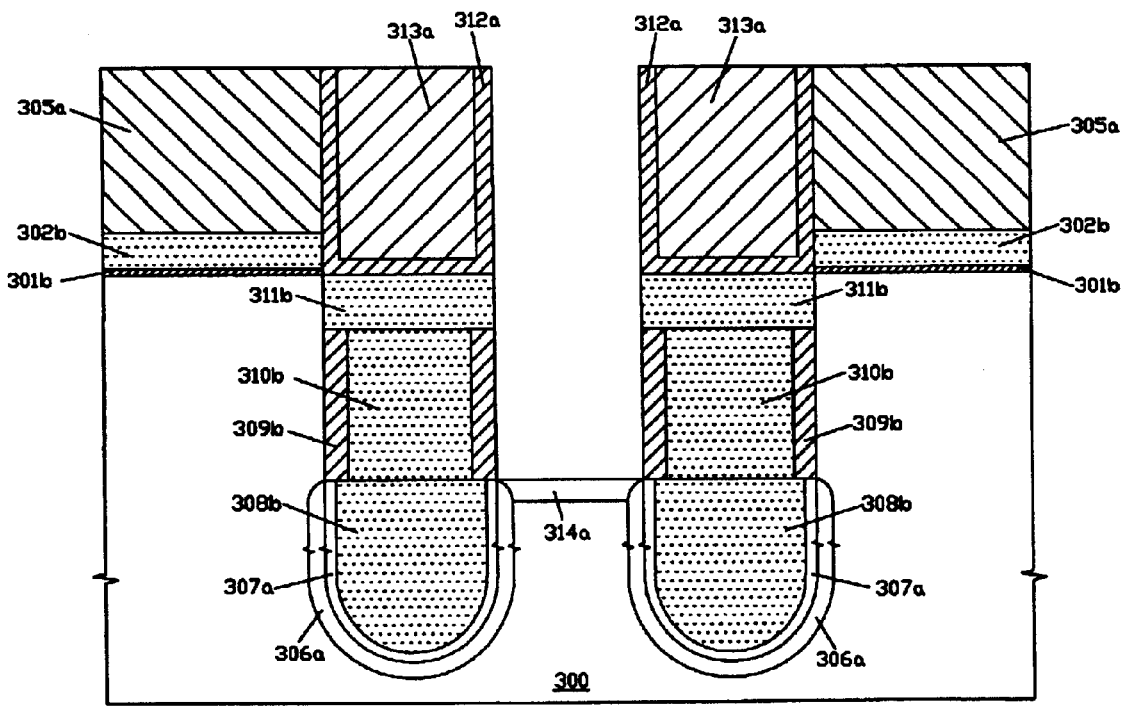

FIG. 3F shows that the second masking dielectric layers 305a between the plurality of masking photoresist (PR3) are selectively removed by anisotropic dry etching; the first conductive layers 302b and the first dielectric layers 301b are sequentially removed by anisotropic dry etching; and subsequently, the exposed semiconductor substrates 300 are anisotropically etched to a depth approximately equal to a bottom surface level of the collar-oxide layer 309b for forming second-type STI regions (STI-2) and an ion-implantation process can be performed by implanting a high dose of doping impurities into the semiconductor substrate 300 in a self-aligned manner to form the heavily-implanted regions 314a of the second conductivity type in the semiconductor substrate 300 between nearby trench capacitors, and then the plurality of masking photoresist (PR3) are stripped. It should be noted that the heavily-implanted region 314a is connected with the lower capacitor nodes 306a of the nearby trench capacitors.

Figure 3G:
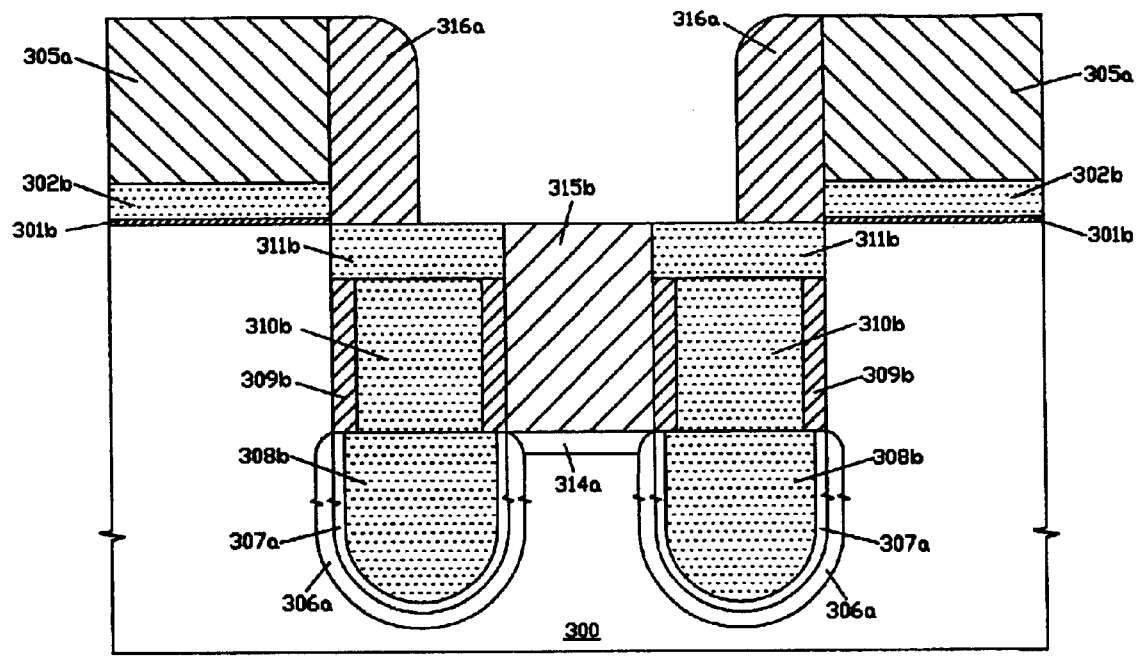

FIG. 3G shows that a second-type planarized field-oxide layer 315a is formed over a gap in a trench-isolation region between the nearby trench regions and various silicon-dioxide layers between the second masking dielectric layers 305a are etched back to a top surface level of the source conductive layers 311b by anisotropic dry etching or wet etching to form a flat surface between the self-aligned lateral-transistor regions; and a pair of first sidewall dielectric spacers 316a are formed over sidewalls formed by the second masking dielectric layer 305a over the first conductive layer 302b and on a portion of the source conductive layers 311b and the first-type fourth raised field-oxide layers 304e in each of the plurality of trench regions. The second-type first planarized field-oxide layer 315b is preferably made of silicon-dioxide, P-glass, or BP-glass as deposited by LPCVD, HDPCVD, or PECVD. The first sidewall dielectric spacer 316a is preferably made of silicon-dioxide as deposited by LPCVD and is formed by first depositing a silicon-dioxide layer 316 over a formed structure surface and then etching back a thickness of the deposited silicon-dioxide layer 316.

Figure 3H:
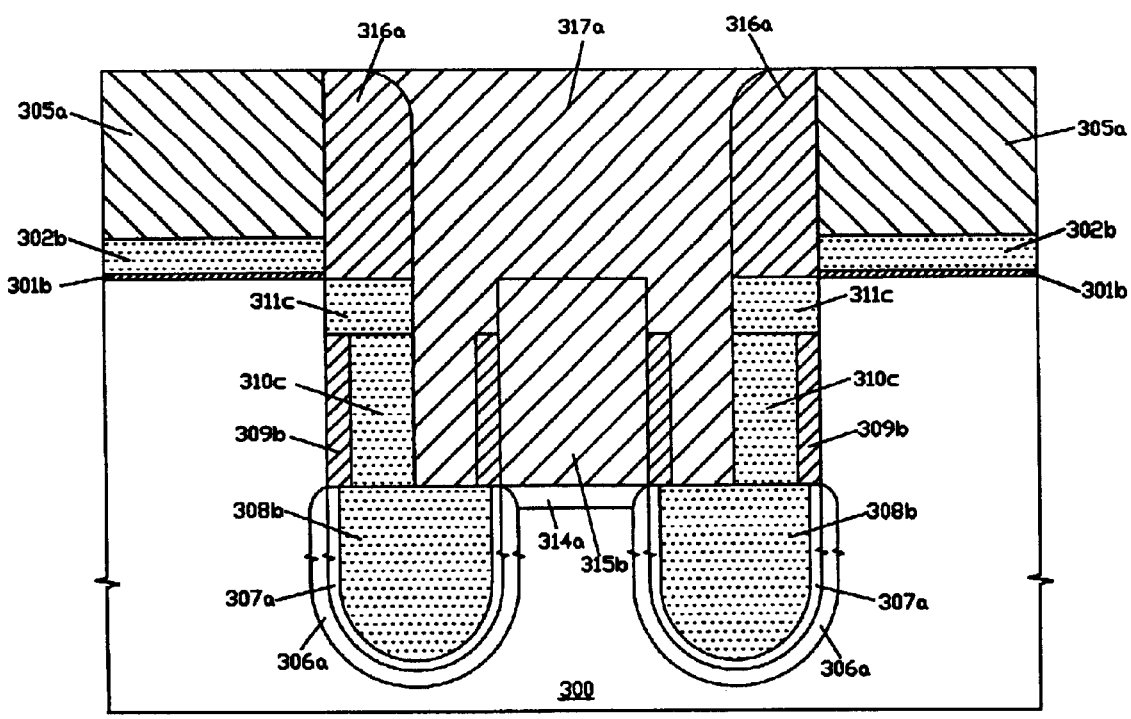

FIG. 3H shows that the source conductive layers 311b and the capacitor-node connector layers 310b between the pair of first sidewall dielectric spacers 316a are sequentially removed by anisotropic dry etching to form source conductive nodes 311c and capacitor-node connectors 310c, respectively; and subsequently, a second planarized thick-oxide layer 317a is formed between the second masking dielectric layers 305a in the self-aligned lateral-transistor regions. The second planarized thick-oxide layer 317a is preferably made of silicon-oxide as deposited by LPCVD, HDPCVD, or PECVD and is formed by first depositing a thick-oxide layer 317 to fill up each gap between the pair of first sidewall dielectric spacers 316a and then planarizing the deposited thick-oxide layer 317 using CMP with the second masking dielectric layer 305a as a polishing stop. It is clearly seen that a pair of source conductive nodes 311c are further separated in a self-aligned manner to reduce the coupling effect between the pair of source conductive nodes 311c.

Figure 3I:
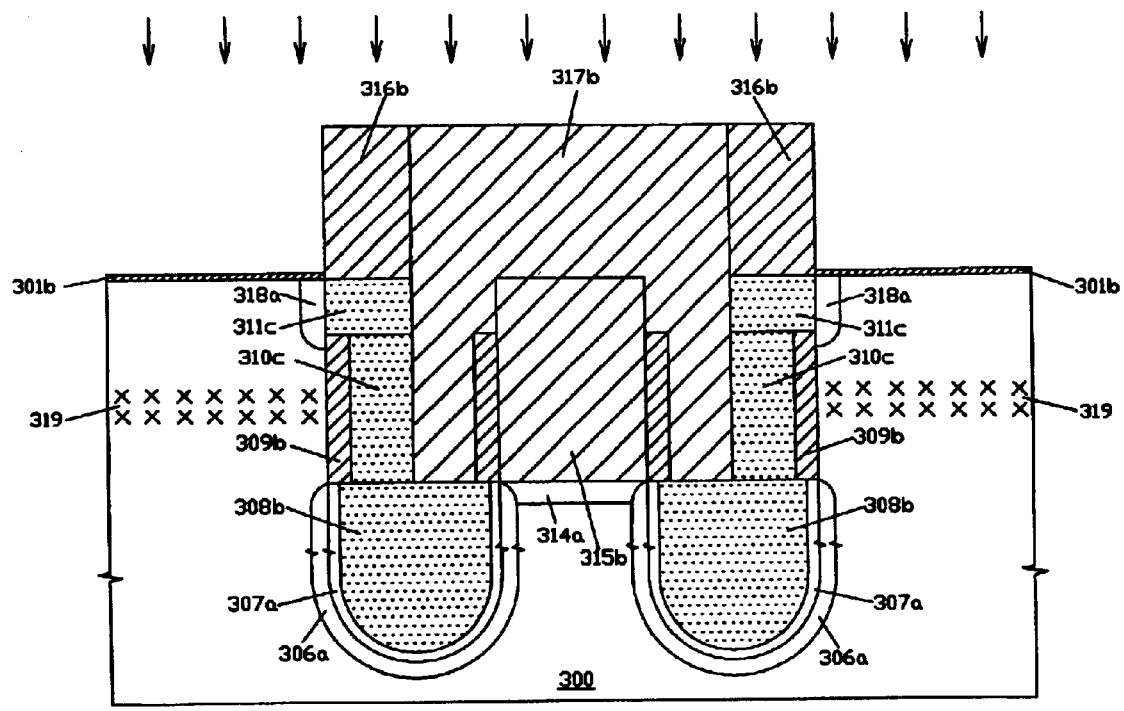

FIG. 3I shows that the second masking dielectric layers 305a over the self-aligned lateral-transistor regions are removed by hot-phosphoric acid or anisotropic dry etching; the formed structure including various silicon-dioxide layers is then etched back anisotropically to a depth equal to a thickness of the first conductive layer 302b, and the first conductive layers 302b are removed by anisotropic dry etching to form a flat surface being alternately formed by a first dielectric layer 301b and a first-type third raised field-oxide layer 304d; and subsequently, an implant region 319 can be formed in the semiconductor substrate 300 of each of the plurality of active regions in a self-aligned manner by implanting doping impurities across the first dielectric layers 301b. The implant region may comprise a deep implant region 319 of the first conductivity type being formed in the semiconductor substrate 300 near a middle portion outside of the collar-oxide layer 309b in each of the plurality of active regions. The deep implant region 319 is used to form a punch-through stop and to simultaneously adjust the threshold-voltage of the parasitic collar-oxide transistor. It is clearly seen that the separation between the merged common-source diffusion region 318a and the lower capacitor node 306a can be made to be smaller without concerning the punch-through effect. Accordingly, the depth of the deep trenches can be made to be shallower for the present invention as compared to the prior art.

Figure 3J:
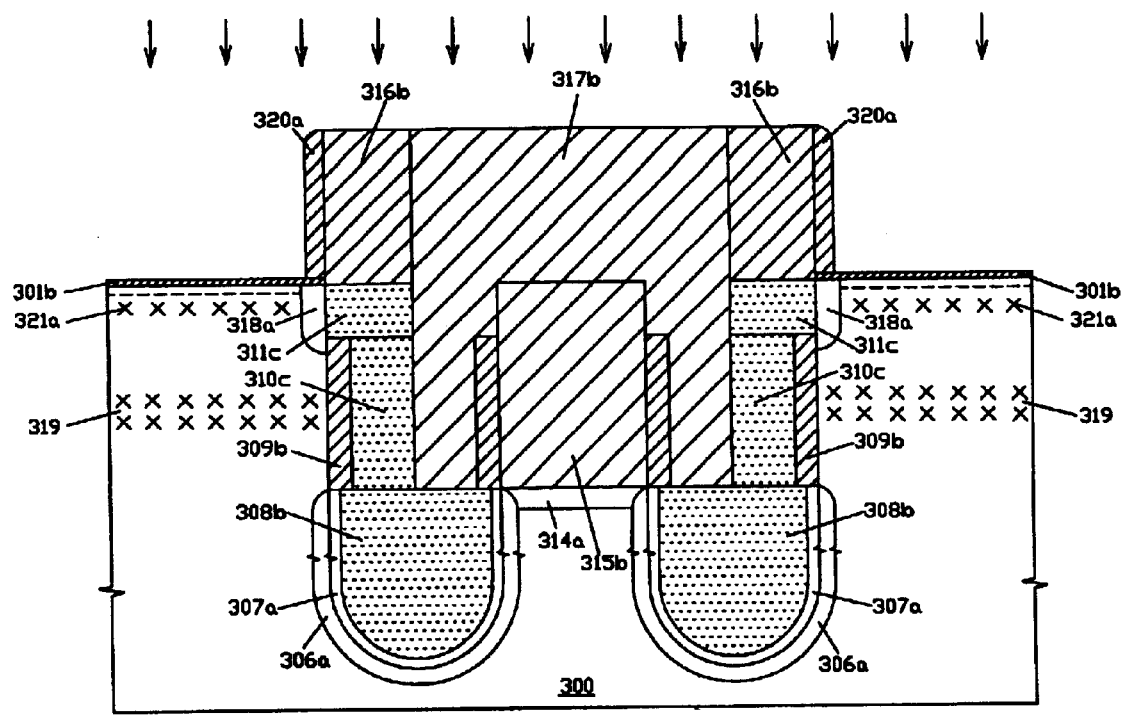

FIG. 3J shows that a pair of second sidewall dielectric spacers 320a are formed over outer sidewalls of nearby etched-back first sidewall dielectric spacers 316b and on a portion of the flat surface being alternately formed by the first dielectric layer 301b and the first-type third raised field-oxide layer 304d; and subsequently, an ion-implantation process is performed by implanting doping impurities of the first conductivity type across the first dielectric layer 301b into the semiconductor substrate 300 in a self-aligned manner to form the implant region 321a in each of the plurality of active regions. The second sidewall dielectric spacer 320a is preferably made of silicon-dioxide as deposited by LPCVD and its spacer width is approximately equal to or slightly smaller than the width of the merged common-source diffusion region 318a to reduce the overlapping capacitance between the conductive-gate layer 323b (see FIG. 4A) and the merged common-source diffusion region 318a. The implant region 321a comprises a shallow implant region as marked by a dash line for threshold-voltage adjustment of the lateral transistor and a deep implant region as marked by the cross symbols for forming a punch-through stop of the lateral transistor.

Referring now to FIG. 4A through FIG. 4E, there are shown the process steps and their cross-sectional views for fabricating a first-type self-aligned lateral-transistor DRAM cell structure and its first-type DRAM array of the present invention after FIG. 3J.

Figure 4A:
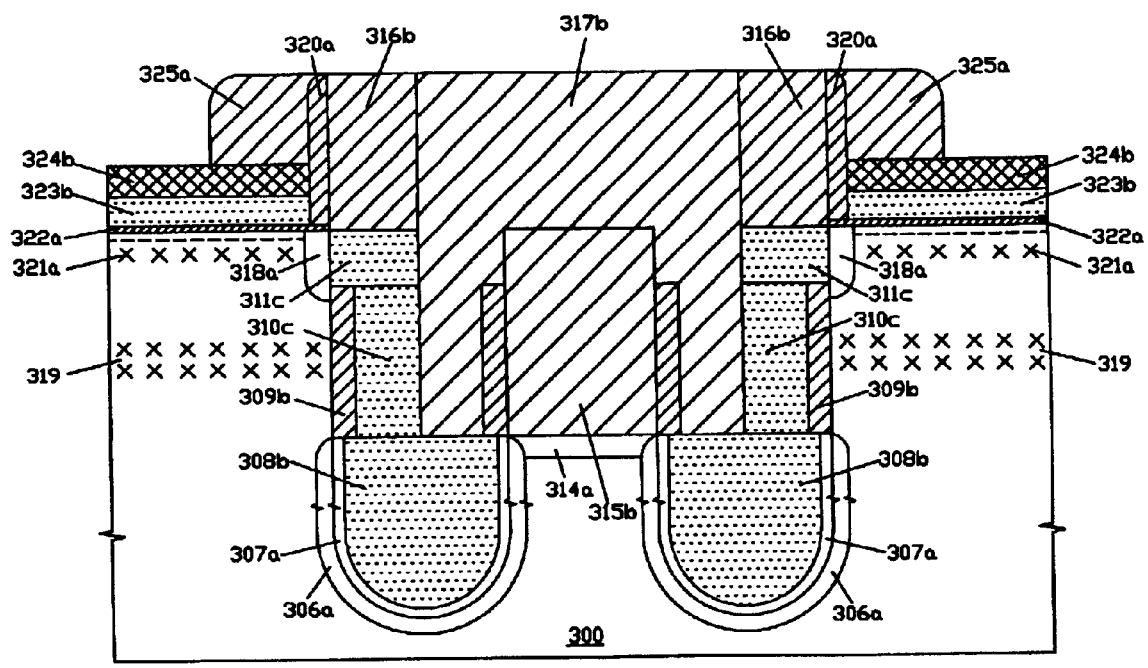
FIG. 4A through FIG. 4E show the process steps and their cross-sectional views of fabricating a self-aligned lateral-transistor DRAM cell structure and its first-type contactless DRAM array of the present invention after FIG. 3J.

FIG. 4A shows that the first dielectric layers 301b between the pair of second sidewall dielectric spacers 320a are removed by dipping in a dilute hydrofluoric acid solution or anisotropic dry etching and the first-type third raised field-oxide layers 304d are simultaneously etched to form the first-type fourth raised field-oxide layers 304e; a gate-dielectric layer 322a is then formed over the exposed semiconductor substrate 300 in each of the plurality of active regions between the pair of second sidewall dielectric spacers 320a; a conductive-gate layer 323b is formed between the pair of second sidewall dielectric spacers 320a and on the gate-dielectric layers 322a and the first-type fourth raised field-oxide layers 304e; and a capping conductive-gate layer 324b is then formed over the conductive-gate layer 323b and a pair of third sidewall dielectric spacers 325a are formed over a portion of the capping conductive-gate layer 324b to define a pair of self-aligned gate-stack regions in each of the self-aligned lateral-transistor regions. The gate-dielectric layer 322a is preferably a thermal-oxide layer or a nitrided thermal-oxide layer as grown by a well-known thermal oxidation process. The conductive-gate layer 323b is preferably made of doped polycrystalline-silicon or doped amorphous-silicon as deposited by LPCVD and is formed by first depositing a thick conductive film 323 to fill up a gap between the pair of second sidewall dielectric spacers 320a and planarizing the deposited thick conductive film 323 using CMP or etching-back, and then etching back the planarized conductive-gate layers 323a to a predetermined thickness. The capping conductive-gate layer 324b is preferably made of tungsten disilicide or tungsten as deposited by LPCVD or sputtering and is formed by a similar method as described for the conductive-gate layer 323b. The third sidewall dielectric spacer 325a is preferably made of silicon-dioxide, silicon-nitride, or silicon-oxynitride as deposited by LPCVD and is formed by depositing a dielectric layer 325 and then etching back a thickness of the deposited dielectric layer 325. Therefore, the gate length of the lateral transistors can be easily controlled by the thickness of the deposited dielectric layer 325 and is scalable.

Figure 4B:
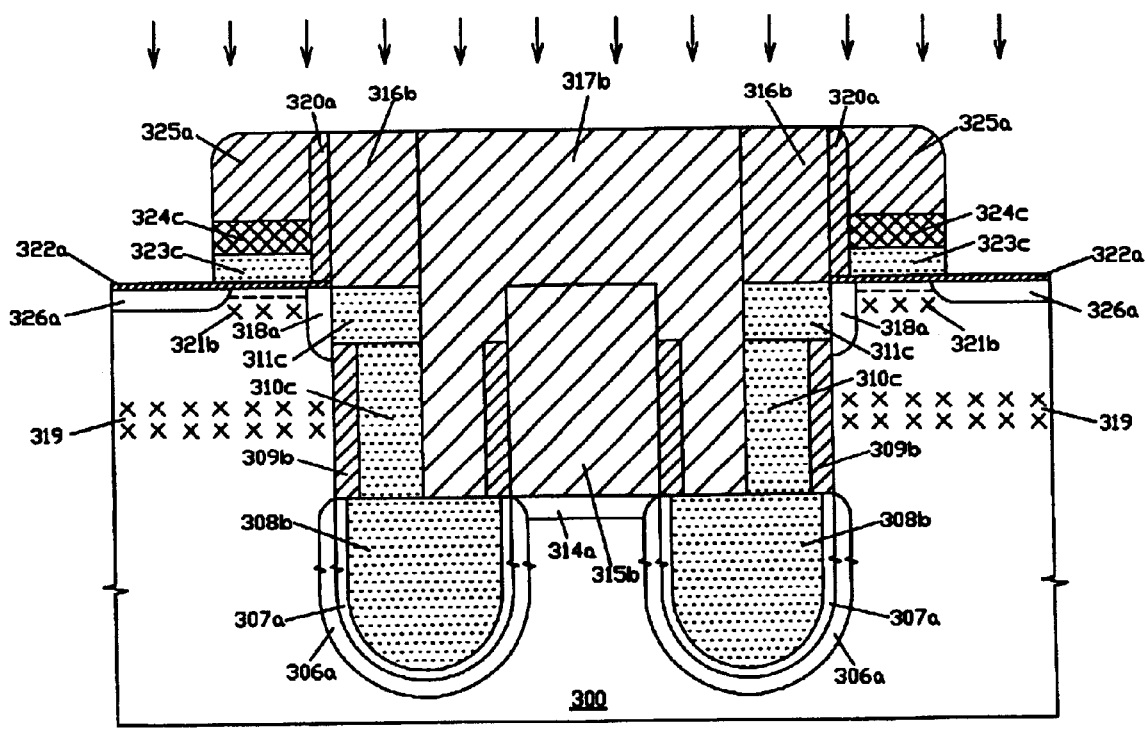

FIG. 4B shows that the capping conductive-gate layer 324b and the conductive-gate layer 323b between the pair of third sidewall dielectric spacers 325a are sequentially removed by using anisotropic dry etching and an ion-implantation is performed by implanting doping impurities across the gate-dielectric layers 322a into the semiconductor substrate 300 to form a lightly-doped common-drain diffusion region 326a of the second conductivity type in each of the plurality of active regions.

Figure 4C:
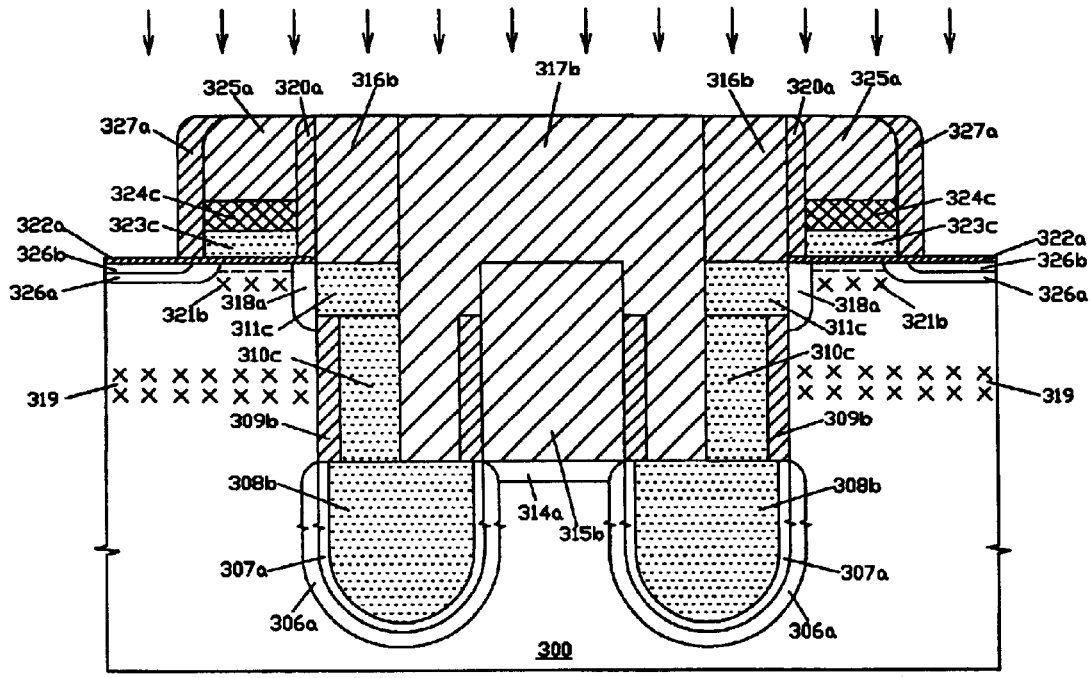

FIG. 4C shows that a pair of fourth sidewall dielectric spacers 327a are formed over outer sidewalls of the pair of third sidewall dielectric spacers 325a and on a portion of the gate-dielectric layers 322a and the first-type fourth raised field-oxide layers 304e, and an ion-implantation process is performed by implanting a high dose of doping impurities across the gate-dielectric layers 322a in a self aligned manner to form a shallow heavily-doped common-drain diffusion 326b region of the second conductivity type within the lightly-doped common-drain diffusion region 326a. The fourth sidewall dielectric spacer 327a is preferably made of silicon-dioxide, silicon-nitride, or silicon-oxynitride as deposited by LPCVD.

Figure 4D:
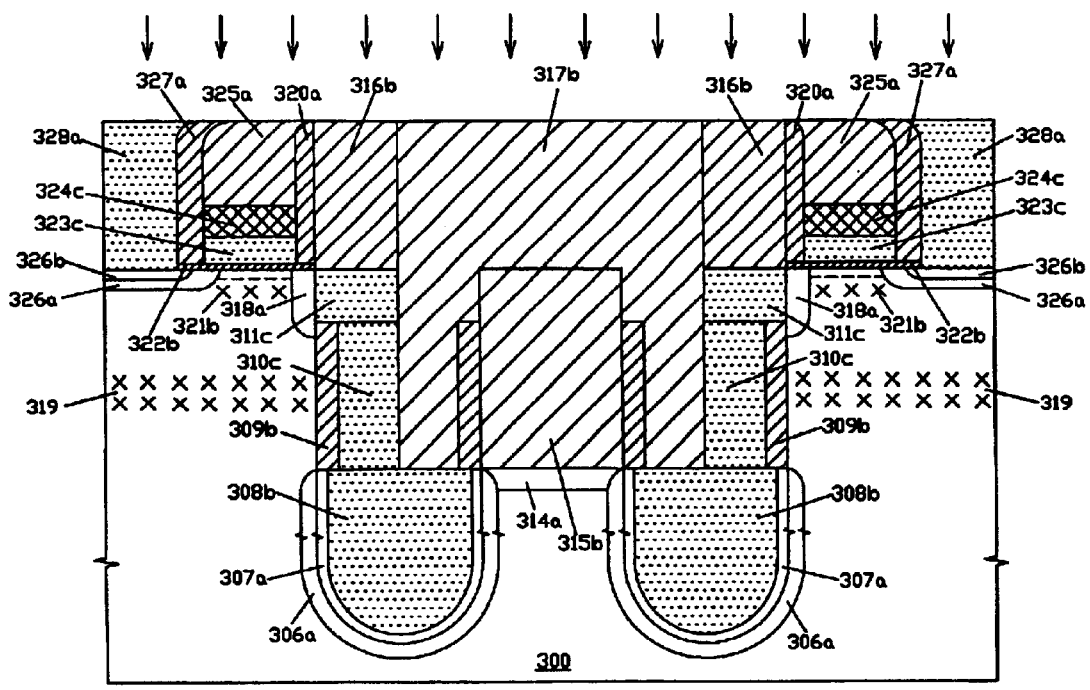

FIG. 4D shows that the gate-dielectric layers 322a between the pair of fourth sidewall dielectric spacers 327a are removed by dipping in a dilute hydrofluoric acid solution and the first-type fourth raised field-oxide layers 304e are simultaneously etched to form a flat bed being alternately formed by the shallow heavily-doped common-drain diffusion region 326b and a first-type fifth raised field-oxide layer 304f; and subsequently, a planarized common-drain conductive layer 328a is formed over the flat bed between the pair of fourth sidewall dielectric spacers 327a in each of the common-drain regions. The planarized common-drain conductive layer 328a is preferably made of doped polycrystalline-silicon and is further heavily implanted with a high-dose of doping impurities of the second conductivity type. The planarized common-drain conductive layer 328a can be silicided with a refractory metal-silicide layer such as a titanium-disilicide (TiSi$_2$) or cobalt-disilicide (CoSi$_2$) layer. Similarly, the planarized common-drain conductive layer 328a may comprise a planarized tungsten layer being lined with a barrier-metal layer such as a-titanium-nitride (TiN) or tantalum-nitride (TaN) layer.

Figure 4E:
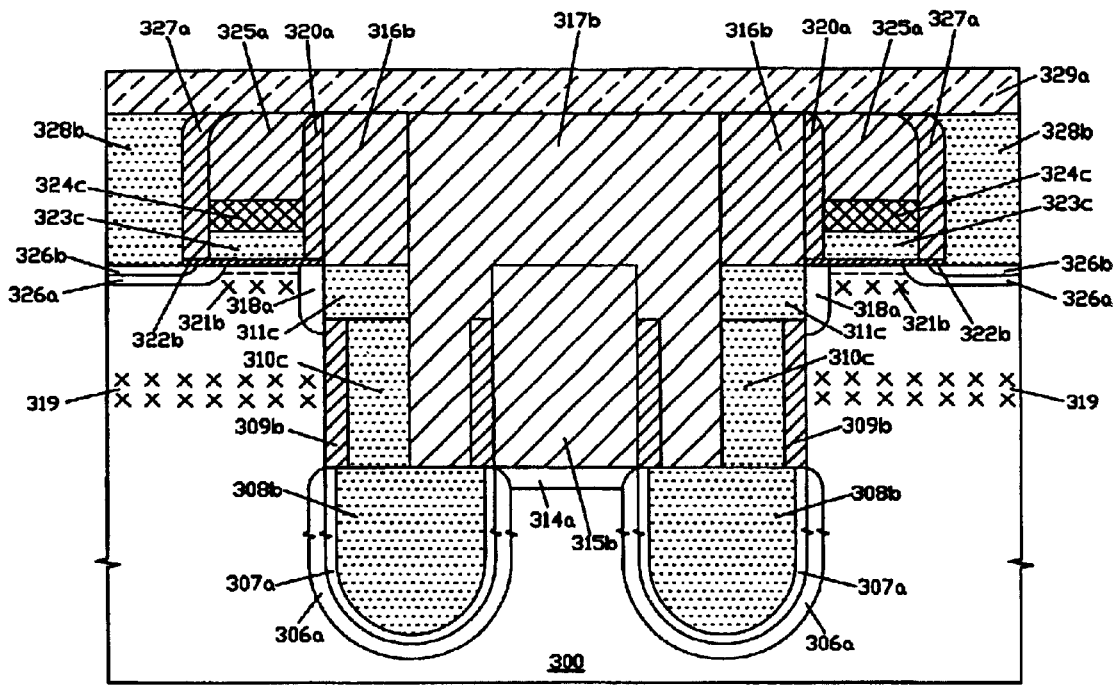

FIG. 4E shows that a metal layer 329 is formed over a formed structure surface shown in FIG. 4D; the metal layer 329 and the planarized common-drain conductive layers 328a are simultaneously patterned and etched by a masking photoresist step being aligned above the plurality of active regions to form a plurality of metal bit-lines 329a integrated with planarized common-drain conductive islands 328b. The metal layer 329 comprises an aluminum or copper layer over a barrier-metal layer. The mask photoresist step comprises a plurality of masking photoresist being aligned above the plurality of active regions or a plurality of hard masking dielectric layers being aligned above the plurality of active regions and a sidewall dielectric spacer being formed over each sidewall of the plurality of hard masking dielectric layers to eliminate misalignment FIG. 4E shows a first-type self-aligned lateral-transistor DRAM cell structure and its first-type contactless DRAM array of the present invention.

Referring now to FIG. 5A through FIG. 5E, there are shown the process steps and their cross-sectional views for fabricating a first-type self-aligned lateral-transistor DARM cell structure and its second-type DRAM array of the present invention after FIG. 3J.

Figure 5A:
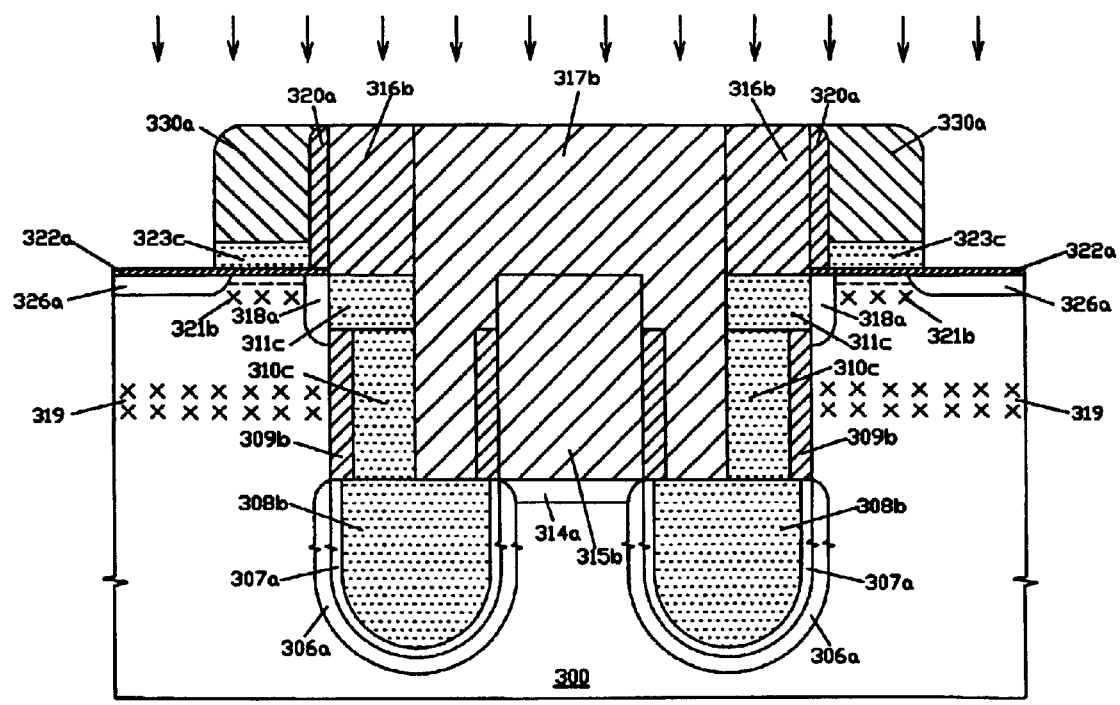
FIG. 5A through FIG. 5E show the process steps and their cross-sectional views of fabricating a self-aligned lateral-transistor DRAM cell structure and its second-type contactless DRAM array of the present invention after FIG. 3J.

FIG. 5A shows that the first dielectric layers 301b between the pair of second sidewall dielectric spacers 3209 are removed by dipping in a dilute hydrofluoric acid solution or anisotropic dry etching and the first-type third raised field-oxide layers 304d are simultaneously etched to form the first-type fourth raised field-oxide layers 304e; a gate-dielectric layer 322a is then formed over the exposed semiconductor substrate 300 in each of the plurality of active regions between the pair of second sidewall dielectric spacers 320a; a conductive-gate layer 323b is formed between the pair of second sidewall dielectric spacers 320a and on the gate-dielectric layers 322a and the first-type fourth raised field-oxide layers 304e; and a pair of third sidewall dielectric spacers 330a are formed over a portion of the conductive-gate layer 323b to define a pair of self-aligned gate-stack regions in each of the self-aligned lateral-transistor regions. The gate-dielectric layer 322a is preferably a thermal-oxide layer or a nitrided layer as grown by a well-known thermal oxidation process. The conductive-gate layer 323b is preferably made of doped polycrystalline-silicon or doped amorphous-silicon as deposited by LPCVD and is formed by first depositing a thick conductive film 323 to fill up a gap between the pair of second sidewall dielectric spacers 320a and planarizing the deposited thick conductive film 323 using CMP or etching-back, and then etching back the planarized conductive-gate layers 323a to a predetermined thickness. The third sidewall dielectric spacer 330a is preferably made of silicon-nitride as deposited by LPCVD and is formed by depositing a dielectric layer 330 and then etching back a thickness of the deposited dielectric layer 330. Therefore, the gate length of the lateral transistors can be easily controlled by the thickness of the deposited dielectric layer 330. FIG. 5A also shows that the conductive-gate layer 323b between the pair of third sidewall dielectric spacers 330a are sequentially removed by using anisotropic dry etching and an ion-implantation is performed by implanting doping impurities across the gate-dielectric layers 322a into the semiconductor substrate 300 in a self-aligned manner to form a lightly-doped common-drain diffusion region 326a of the second conductivity type in each of the plurality of active regions.

Figure 5B:
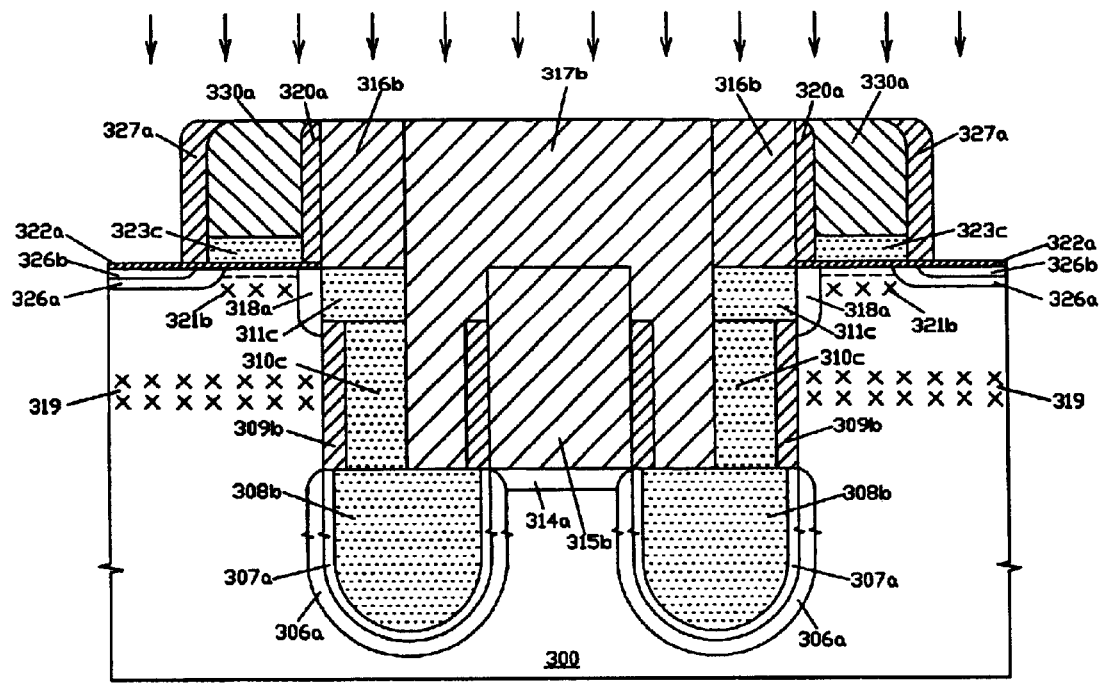

FIG. 5B shows that a pair of fourth sidewall dielectric spacers 327a are formed over outer sidewalls of the pair of third sidewall dielectric spacers 330a and on a portion of the gate-dielectric layers 322a and the first-type fourth raised field-oxide layers 304e, and an ion-implantation process is performed by implanting doping impurities across the gate-dielectric layers 322a into the semiconductor substrate 300 in a self-aligned manner to form a shallow heavily-doped common-drain diffusion region 326b of the second conductivity type within the lightly-doped common-drain diffusion region 326a. The fourth sidewall dielectric spacer 327a is preferably made of silicon-dioxide as deposited by LPCVD.

Figure 5C:
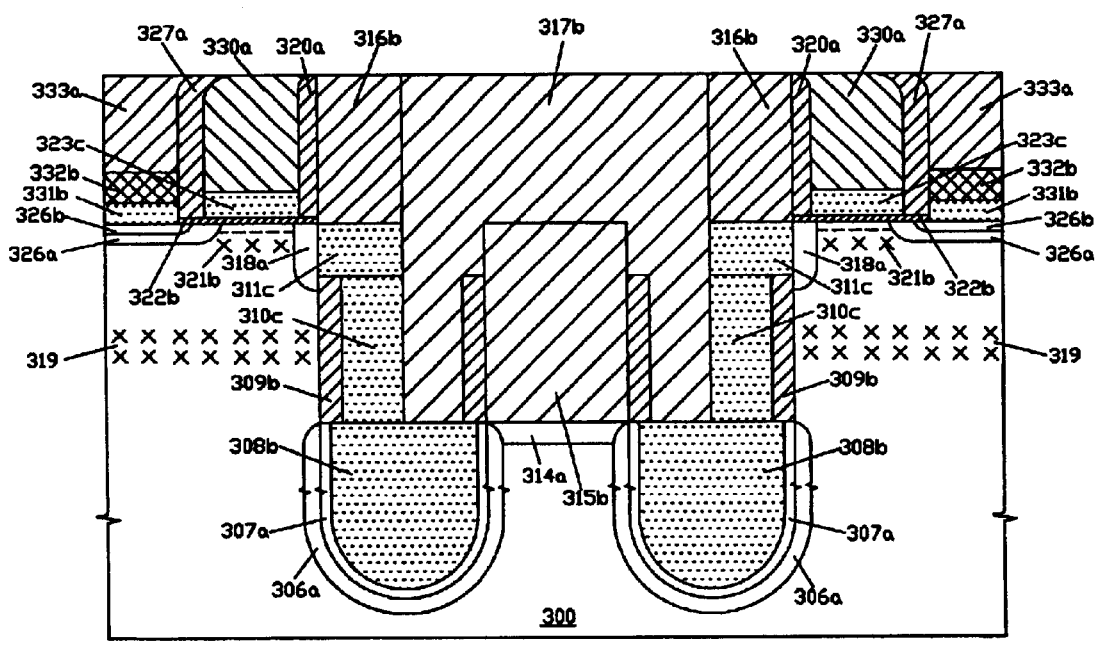

FIG. 5C shows that the gate-dielectric layers 322a between the pair of fourth sidewall dielectric spacers 327a are removed by dipping in a dilute hydrofluoric acid solution or anisotropic dry etching, and the first-type fourth raised field-oxide layers 304e are simultaneously etched to form a flat bed between the pair of fourth sidewall dielectric spacers 327a in each of the common-drain regions, as described in FIG. 4D; a doped polycrystalline-silicon layer 331b capped with a tungsten-disilicide (WSi$_2$) or tungsten (W) layer 332b or silicided with a refractory metal-silicide layer 332b such as a titanium-disilicide (TiSi$_2$) or cobalt-disilicide (CoSi$_2$) layer is formed over the flat bed to act as a common-drain conductive bit-line 332b/331b; and a third planarized thick-oxide layer 333a is formed over the common-drain conductive bit-line 332b/331b in each of the common-drain regions. The third planarized thick-oxide layer 333a is preferably made of silicon-dioxide, P-glass, or BP-glass as deposited by LPCVD, HDPCVD, or PECVD. The doped polycrystalline-silicon layer 331b is preferably deposited by LPCVD and is further implanted with a high-dose of doping impurities of the second conductivity type.

Figure 5D:
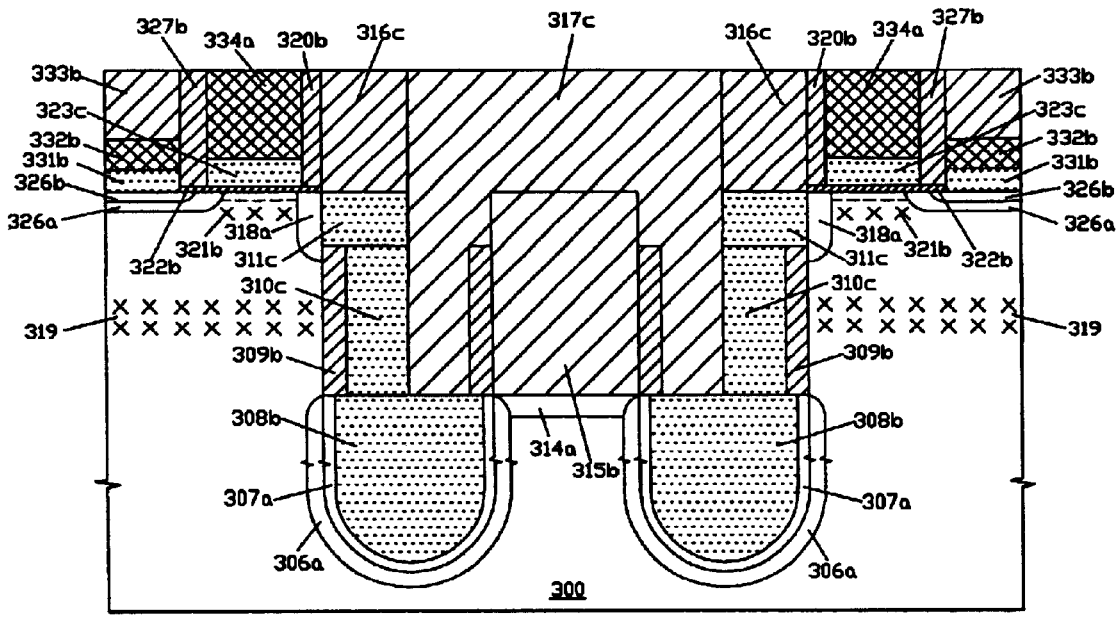

FIG. 5D shows that various silicon-dioxide layers as shown in FIG. 5C are etched back to eliminate the curve portions of the pair of fourth sidewall dielectric spacers 327a and the pair of third sidewall dielectric spacers 330a are then removed by hot-phosphoric acid or anisotropic dry etching; and subsequently, the planarized capping conductive-gate layers 334a are refilled. The planarized capping conductive-gate layer 334a is preferably made of tungsten-disilicide (WSi2) or tungsten (W) as deposited by LPCVD or sputtering and is formed by first depositing a thick conductive layer 334 to fill up each gap between the etched fourth sidewall dielectric spacer 327b and the etched second sidewall dielectric spacer 320b and then planarizing the deposited thick conductive layer 334 using CMP or etching-back technique. It should be noted that a barrier-metal layer can be deposited before depositing the thick conductive layer 334 as a liner.

Figure 5E:
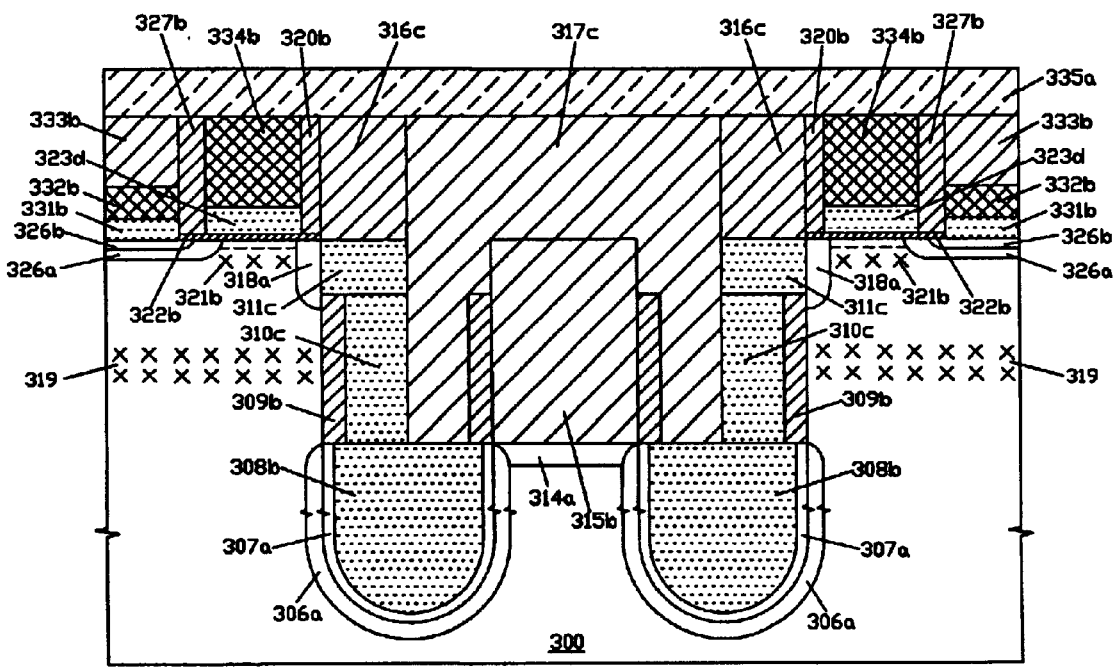

FIG. 5E shows that a metal layer 335 is formed over a formed structure surface as shown in FIG. 5D and a metal layer 335 together with the planarized capping conductive-gate layers 334a over the conductive-gate layers 323c are simultaneously patterned by a masking photoresist step as described in FIG. 4E to form the plurality of metal word-lines 335a integrated with planarized capping conductive-gate islands 334b over conductive-gate islands 323d. The metal layer 335 may comprise an aluminum or copper layer over a barrier-metal layer such as a titanium-nitride (TiN) or tantalum-nitride (TaN) layer.

Figure 6A:
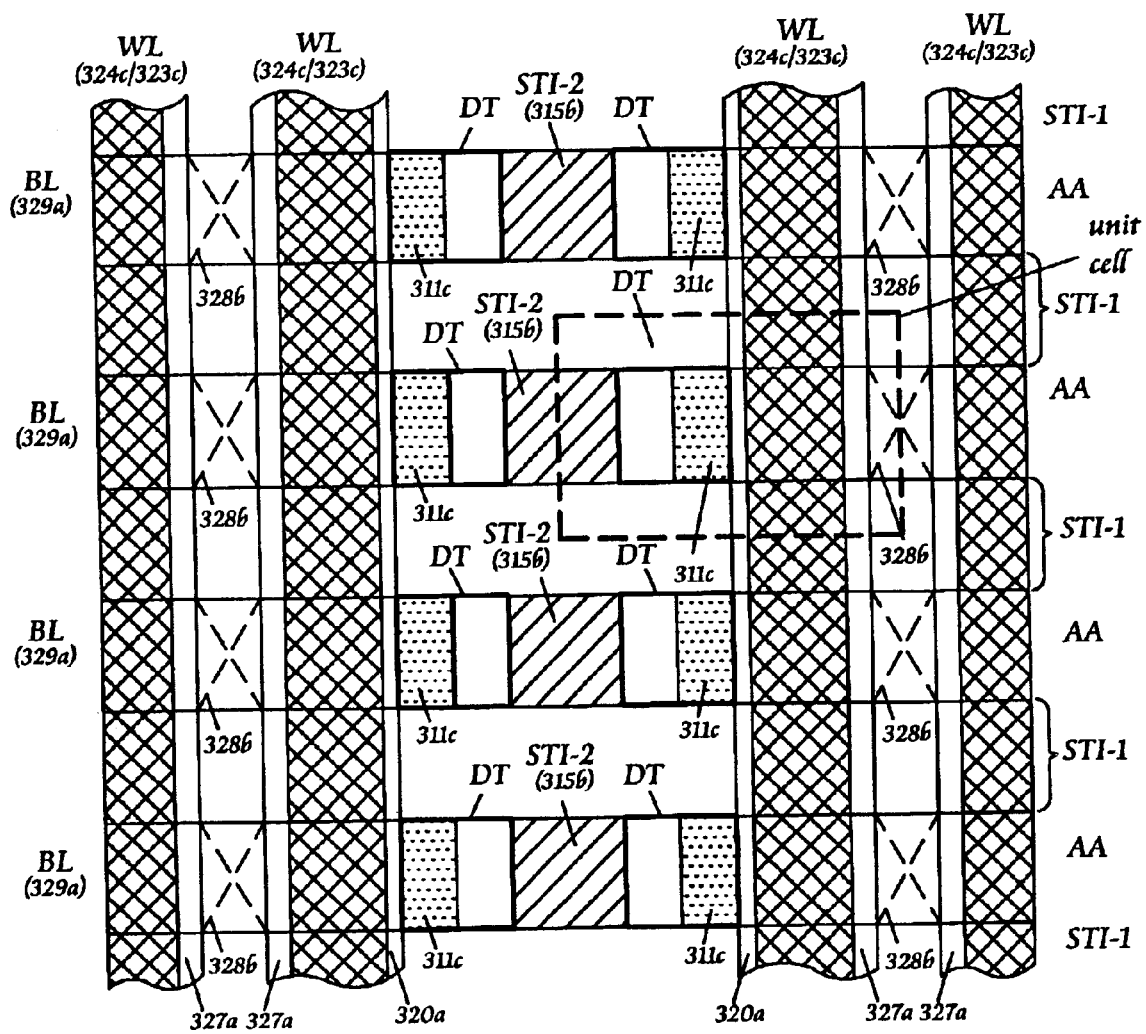
FIG. 6A shows a top plan view of a first-type contactless DRAM array of the present invention.

FIG. 6A shows a top plan view of the first-type contactless DRAM array, in which the plurality of metal bit-lines (BL) 329a integrated with the planarized common-drain conductive islands 328b are formed to be aligned above the plurality of active regions (AA), wherein the planarized common-drain conductive islands 328b are formed over the shallow heavily-doped common-drain diffusion regions 326b between the pair of fourth sidewall dielectric spacers 327a; the plurality of first-type STI regions (STI-1) and the plurality of active regions (AA) are formed alternately on said semiconductor substrate 300; the plurality of conductive word-lines (WL) 324c being connected with the conductive-gate layers 323c are defined by a pair of third sidewall dielectric spacers 325a. The source conductive node 311c is partially formed in the deep trench (DT) and is patterned by a first sidewall dielectric spacer 316a; and the second-type STI region (STI-2) being filled with the second-type first raised field-oxide layer 315b is formed in the active region. From FIG. 6A, the unit cell size as marked by a dash square can be made to be equal to or smaller than 6 $F^2$ if the width of the self-aligned lateral-transistor region is defined to be equal to or smaller than 1.5 F.

Figure 6B:
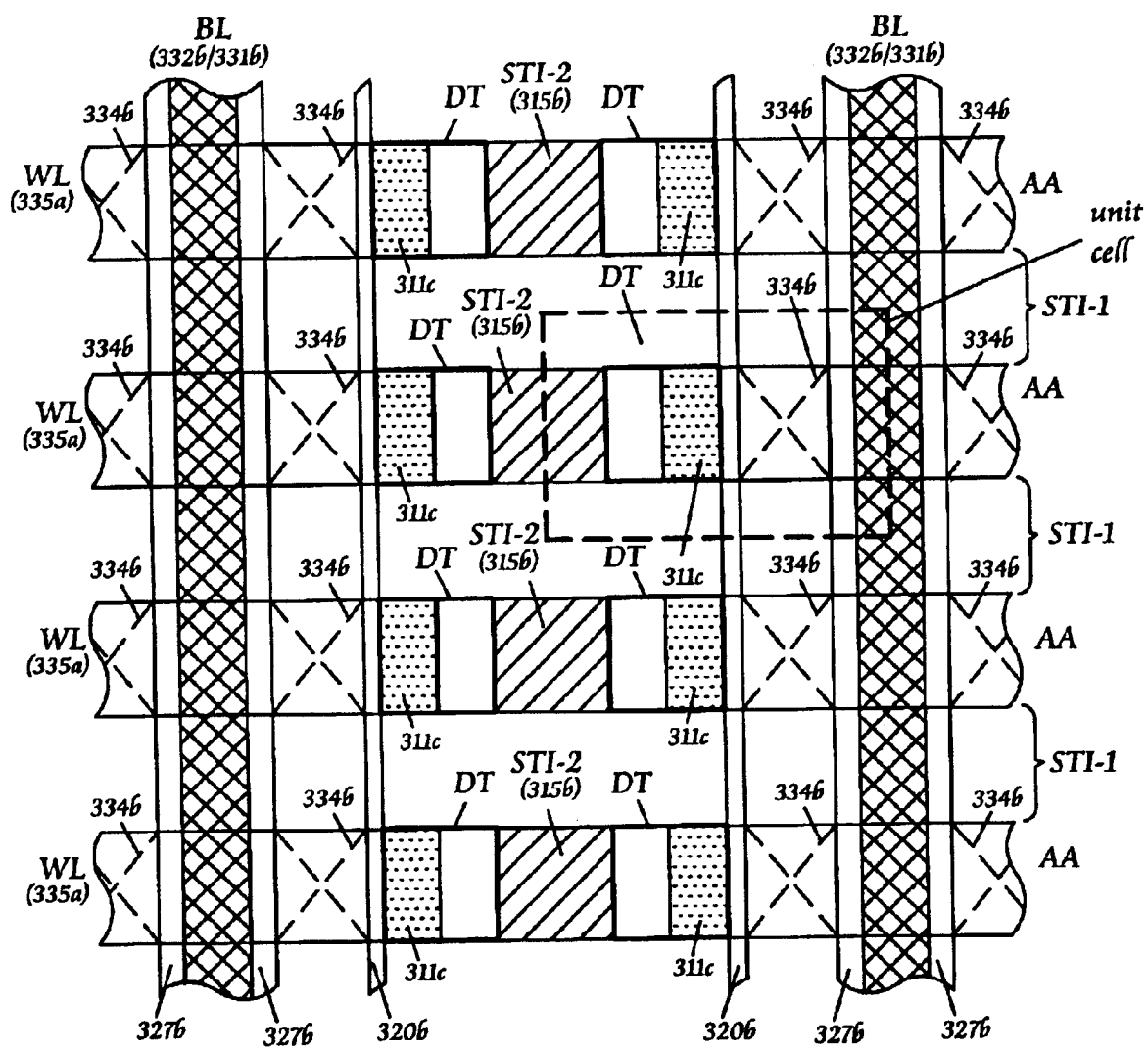
FIG. 6B shows a top plan view of a second-type contactless DRAM array of the present invention.

FIG. 6B shows a top plan view of a second-type contactless DRAM array of the present invention, in which the plurality of metal word-lines (WL) 335a integrated with the planarized capping conductive-gate islands 334b over the conductive-gate islands 323d are formed to be aligned above the plurality of active regions (AA); each of the plurality of conductive bit-lines (BL) 332b over the heavily-doped polycrystalline-silicon layer 331b being formed between the pair of fourth sidewall dielectric spacers 327b is formed over the flat bed being alternately formed by the shallow heavily-doped common-drain diffusion region 326b and the first-type fifth raised field-oxide layer 304f; the plurality of first-type STI regions (STI-1) and the plurality of active regions (AA) are formed alternately on the semiconductor substrate 300; each of the plurality of deep trenches (DT) is partially filled with the source conductive node 311c; the second-type STI region (STI-2) is formed between the pair of deep-trenches (DT); and the pair of first sidewall dielectric spacers 316c are formed over each sidewall of nearby self-aligned lateral-transistor regions to define the source conductive nodes 311c. Similarly, a cell size of the second-type self-aligned lateral-transistor DRAM cell structure as marked by a dash square can be made to be equal to 6 $F^2$ or smaller if the width of the self-aligned lateral transistor region is defined to be equal to or smaller than 1.5 $F^2$.

Accordingly, the advantages and the features of a self-aligned lateral-transistor DRAM cell structure and its contactless DARM arrays of the present invention are summarized as below:

(a) The self-aligned lateral-transistor DRAM cell structure of the present invention may offer a DRAM cell size of 6 $F^2$ or smaller through reducing the surface area occupied by the self-aligned lateral-transistor region using self-aligned techniques.

(b) The self-aligned lateral-transistor DRAM cell structure of the present invention can be fabricated with less critical masking photoresist steps to reduce the cost of manufacturing.

(c) The self-aligned lateral-transistor DRAM cell structure of the present invention can be fabricated by using a shallower depth of the deep trenches by decreasing the separation length of the collar-oxide layer through self-aligned ion-implantation.

(d) The self-aligned lateral-transistor DRAM cell structure of the present invention offers the second-type STI regions with a depth approximately equal to a bottom surface level of the collar-oxide layer for nearby DRAM capacitors to reduce the possible coupling effects between the nearby DRAM cells.

(e) The first-type contactless DRAM array of the present invention offers the plurality of metal bit-lines integrated with the planarized common-drain conductive islands and the plurality of conductive word-lines for obtaining high-speed read and write operations.

(f) The second-type contactless DRAM array of the present invention offers the plurality of metal word-lines integrated with the planarized capping conductive-gate islands over the conductive-gate islands and the plurality of conductive bit-lines for obtaining high-speed read and write operations.

While the present invention has been particularly shown and described with references to the present examples and embodiments as considered as illustrative and not restrictive. Moreover, the present invention is not to be limited to the details given herein, it will be understood by those skilled in the art that various changes in forms and details may be made without departure from the true spirit and scope of the present invention.

What is claim is:

1. A self-aligned lateral-transistor DRAM cell structure, comprising:

a semiconductor substrate of a first conductivity type having an active region and two first-type shallow-trench-isolation (STI-1) regions, wherein said active region is located between said two first-type STI regions;

a DRAM cell comprising a trench region, a trench-isolation region, and a self aligned lateral-transistor region being formed on said semiconductor substrate, wherein said trench region being formed between said self-aligned lateral-transistor region and said trench-isolation region comprises a deep-trench region being formed in said active region and said trench-isolation region comprises a second-type STI region outside of said deep-trench region being formed in said active region;

said second-type STI region comprising a second-type first raised field-oxide layer;

said deep-trench region comprising a trench capacitor being formed in a lower portion of a deep trench, a collar-oxide layer together with a capacitor-node connector being formed in a middle portion of said deep trench, and a source conductive node being formed in an upper portion of said deep trench to act as a dopant diffusion source for forming a merged common-source diffusion region of a second conductivity type in said semiconductor substrate near a side portion of said source conductive node, wherein said source conductive node and said capacitor-node connector are defined by a first sidewall dielectric spacer being formed over a sidewall of said self-aligned lateral-transistor region;

said trench capacitor comprising an upper capacitor node being formed over a capacitor-dielectric layer and said capacitor-dielectric layer being formed over a lower capacitor node in said semiconductor substrate;

said self-aligned lateral-transistor region comprising a second sidewall dielectric spacer spaced by a first dielectric layer being formed on said merged common-source diffusion region, a self-aligned gate-stack region defined by a third sidewall dielectric spacer being formed over an outer sidewall of said second sidewall dielectric spacer, a lightly-doped common-drain diffusion region of said second conductivity type being formed in said semiconductor substrate of said active region by aligning to an outer edge of said self-aligned gate-stack region, a fourth sidewall dielectric spacer being formed over an outer sidewall of said self-aligned gate-stacked region, and a shallow heavily-doped common-drain diffusion region of said second conductivity type being formed within said lightly-doped common-drain diffusion region by aligning to an outer edge of said fourth sidewall dielectric spacer; and a deep implant region of said first conductivity type being formed in said semiconductor substrate near a middle portion outside of said collar-oxide layer.

2. The self-aligned lateral-transistor DRAM cell structure according to claim 1, wherein a planarized common-drain conductive island is formed over said shallow heavily-doped common-drain diffusion region outside of said fourth sidewall dielectric spacer and a metal bit-line integrated with said planarized common-drain conductive island are simultaneously patterned by masking photoresist step being aligned above said active region for forming a first-type self-aligned lateral-transistor DRAM cell.

3. The self-aligned lateral-transistor DRAM cell structure according to claim 1, wherein a common-drain conductive bus-line being acted as a bit line is formed over said shallow heavily-doped common-drained diffusion region and two first-type fifth raised field-oxide layers outside of said fourth sidewall dielectric spacer and an etched-back third planarized thick-oxide is formed over said common-drain conductive bus line for forming a second-type self-aligned lateral-transistor DRAM cell.

4. The self-aligned lateral-transistor DRAM cell structure according to claim 1, wherein said self-aligned gate-stack region comprises from top to bottom said third sidewall dielectric spacer, a capping conductive-gate layer, and a conductive-gate layer over a flat surface formed by a gate-dielectric layer and two first-type fourth raised field-oxide layers and said capping conductive-gate layer over said conductive-gate layer is acted as a conductive word-line for forming a first-type self-aligned lateral-transistor DRAM cell.

5. The self-aligned lateral-transistor DRAM cell structure according to claim 1, wherein said self-aligned gate-stack region comprises from top to bottom a planarized capping conductive-gate island, a conductive-gate island, and a gate-dielectric layer and a metal word-line integrated with said planarized capping conductive-gate island over said conductive-gate island are simultaneously pattern by masking photoresist step being aligned above said active region for forming a second-type self-aligned lateral-transistor DRAM cell.

6. The self-aligned lateral-transistor DRAM cell structure according to claim 1, wherein a bottom surface level of said second-type first raised field-oxide layer is approximately equal to that of said collar-oxide layer and a heavily-implanted region of said second conductivity type being formed under said second-type first raised field-oxide layer is connected with said lower capacitor node being formed by a heavy-doped diffusion region of said second conductivity type.

7. A contactless DRAM array, comprising:

a semiconductor substrate of a first conductivity type having a plurality of active regions and a plurality of first-type shallow-trench-isolation (STI) regions formed alternately;

a plurality of trench regions being formed on said semiconductor substrate and transversely to the plurality active regions, wherein each of the plurality of trench regions is being formed between a trench-isolation region and a self-aligned lateral-transistor region;

each of the plurality of trench regions being alternately formed by a deep trench in said active region and said first-type STI region, wherein said deep trench comprises a trench capacitor being formed in a lower portion of said deep trench, a collar-oxide layer together with a capacitor-node connector being formed in a middle portion of said deep trench, and a source conductive node being formed in an upper portion of said deep trench;

said trench-isolation region being alternately formed by a second-type STI region in active region and said first-type STI region, wherein said second-type STI region comprises a second-type first raised field-oxide layer and said first-type STI region comprises a first-type fourth raised field-oxide layer;

said trench capacitor comprising an upper capacitor node being formed over a capacitor-dielectric layer and said capacitor-dielectric layer being formed over capacitor node in said semiconductor substrate;

said source conductive nodes together with said capacitor-node connectors in each of the plurality of trench regions being simultaneously patterned by a first sidewall dielectric spacer formed over an outer sidewall of said self-aligned lateral-transistor regions, wherein said source conductive node is acted as a dopant diffusion source for forming a merged common-source diffusion region of a second conductivity type in an upper portion of said semiconductor substrate near said source conductive node and a top surface level of said source conductive node is approximately equal to that of said semiconductor substrate;

said self-aligned lateral-transistor region comprising a pair of second sidewall dielectric spacers being formed over outer sidewall of nearby trench regions and on a flat surface being alternately formed by a first dielectric layer over said merged common-source diffusion region in said active region and a first-type third raised field-oxide layer in said first-type STI region, a pair of self-aligned gate-stacked region being formed between said pair of second sidewall dielectric spacers and on a surface being alternately formed by a gate-dielectric layer in said active region and said first-type fourth raised field-oxide layer in said first-type STI region, and a common-drain region being formed between said pair of self-aligned gate-stack regions, wherein said pair of said self-aligned gate-stack regions are defined by a pair of third sidewall dielectric spacers being formed over outer sidewalls of said pair of second sidewall dielectric spacers;

said common-drain region comprising a lightly-doped common-drain diffusion region of said second conductivity type being formed in each of the plurality of active region between said pair of said-aligned gate-stack regions, a pair of fourth sidewall dielectric spacers being formed over outer sidewalls of said pair of self-aligned gate-stacked regions, and a flat bed being formed between said pair of fourth sidewall dielectric spacers, wherein said flat bed is alternately formed by a shallow heavily-doped common-drained diffusion region of said second conductivity type being formed within said lightly-doped common-drained diffusion region and a first-type fifth raised field-oxide layer; and a deep implant region of said first conductivity type being formed in said semiconductor substrate near a middle portion outside of said collar-oxide layer for each of the plurality of active regions under said self-aligned lateral-transistor region.

8. The contactless DRAM array according to claim 7, wherein a plurality of planarized common-drained conductive islands are formed over said shallow heavily-doped common-drained diffusion regions between said pair of fourth sidewall dielectric spacers and a plurality of metal bit-lines integrated with said planarized common-drained conductive islands are simultaneously patterned by masking photoresist step being aligned above the plurality of active region for forming a first-type contactless DRAM array.

9. The contactless DRAM array according to claim 7, wherein a drain conductive bus-line being acted as a conductive bit-line is formed over said flat bed said pair of fourth sidewall dielectric spacers in each said common-drain regions and an etched-back third planarized thick-oxide layer is formed over each of said common-drain conductive bus-line for forming a second-type contactless DRAM array.

10. The contactless DRAM array according to claim 7, wherein each of self-aligned gate-stack region comprises said third sidewall dielectric spacer being formed over a capping conductive-gate layer, said capping conductive-gate layer being formed over a conductive-gate layer, said conductive-gate layer being formed over said surface being alternately formed by said gate-dielectric layer and said first-type fourth raised field-oxide layer and said capping conductive-gate layer over said conductive-gate acted as a conductive word-line for forming a first-type contactless DRAM array.

11. The contactless DRAM array according to claim 7, wherein each of self-aligned gate-stack region comprises a plurality of planarized capping conductive-gate islands being formed over a plurality of conductive-gate islands being and the plurality of conductive-gate islands being formed over a plurality of gate-dielectric layer and a plurality of metal word-line integrated with said planarized capping conductive-gate islands over said conductive-gate islands are simultaneously patterned by a masking photoresist step being aligned above the plurality of active regions for forming a second-type contactless DRAM array.

12. The contactless DRAM array according to claim 7, wherein a bottom surface level of said second-type first raised field-oxide layer is approximately equal to that of said collar-oxide layer and a heavily-implanted region of said second conductivity type being formed under said second-type first raised field-oxide layer is connected with said lower capacitor node being formed by a heavy-doped diffusion region of said second conductivity type.

* * * * *